(12) United States Patent
Boistard et al.

(10) Patent No.: US 12,261,249 B2
(45) Date of Patent: Mar. 25, 2025

(54) METHOD FOR PRODUCING AN OPTOELECTRONIC DEVICE

(71) Applicant: Aledia, Echirolles (FR)

(72) Inventors: Maxime Boistard, Grenoble (FR); Philippe Gibert, Saint-Etienne-de-Crossey (FR); Frédéric Mayer, Voiron (FR); Eric Pourquier, Grenoble (FR); Sylvia Scaringella, Montbonnot-Saint-Martin (FR); Clémence Tallet, Saint Egreve (FR)

(73) Assignee: Aledia, Champagnier (FR)

( * ) Notice: Subject to any disclaimer, the term of this patent is extended or adjusted under 35 U.S.C. 154(b) by 233 days.

(21) Appl. No.: 17/767,253

(22) PCT Filed: Oct. 1, 2020

(86) PCT No.: PCT/EP2020/077472
§ 371 (c)(1),
(2) Date: Apr. 7, 2022

(87) PCT Pub. No.: WO2021/069288
PCT Pub. Date: Apr. 15, 2021

(65) Prior Publication Data
US 2022/0367762 A1   Nov. 17, 2022

(30) Foreign Application Priority Data
Oct. 8, 2019   (FR) .................................. 1911133

(51) Int. Cl.
*H01L 33/50* (2010.01)
*H01L 21/306* (2006.01)
(Continued)

(52) U.S. Cl.
CPC ...... *H01L 33/504* (2013.01); *H01L 21/30625* (2013.01); *H01L 25/0753* (2013.01);
(Continued)

(58) Field of Classification Search
CPC ............. H01L 33/504; H01L 21/30625; H01L 25/0753; H01L 27/156; H01L 33/005;
(Continued)

(56) References Cited

U.S. PATENT DOCUMENTS

2005/0059178 A1* 3/2005 Erchak ................ H01L 33/0093
257/E33.068
2018/0047880 A1   2/2018 Lim et al.
(Continued)

FOREIGN PATENT DOCUMENTS

WO   WO 2018/002485 A1   1/2018

OTHER PUBLICATIONS

International Preliminary Report on Patentability for International Application No. PCT/EP2020/077472, mailed Apr. 21, 2022.
(Continued)

*Primary Examiner* — Duy Vu N Deo
(74) *Attorney, Agent, or Firm* — Wolf, Greenfield & Sacks, P.C.

(57) ABSTRACT

A method of manufacturing an optoelectronic device including assemblies of light-emitting diodes (LED) having first and second assemblies and first blocks made of a first photoluminescent material, each covering one of the first assemblies. The method includes the forming of a layer covering the first and second assemblies, the delimiting of first openings in the layer to expose the first assemblies, the filling of the first openings with the first material, and the performing of a chemical-mechanical polishing to delimit the first blocks.

15 Claims, 14 Drawing Sheets

(51) Int. Cl.
     *H01L 25/075*   (2006.01)
     *H01L 27/15*    (2006.01)
     *H01L 33/00*    (2010.01)
     *H01L 33/62*    (2010.01)

(52) U.S. Cl.
     CPC .......... *H01L 27/156* (2013.01); *H01L 33/005* (2013.01); *H01L 33/62* (2013.01); *H01L 2933/00* (2013.01)

(58) Field of Classification Search
     CPC ................ H01L 33/62; H01L 2933/00; H01L 2933/0041
     USPC ....................................................... 438/692
     See application file for complete search history.

(56) References Cited

U.S. PATENT DOCUMENTS

2018/0301594 A1\* 10/2018 Bouvier ................ H01L 33/385
2019/0165040 A1\*  5/2019 Dupont .................. H01L 33/62

OTHER PUBLICATIONS

PCT/EP2020/077472, Nov. 25, 2020, International Search Report and Written Opinion
International Search Report and Written Opinion for International Application No. PCT/EP2020/077472, mailed Nov. 25, 2020.

\* cited by examiner

METHOD FOR PRODUCING AN OPTOELECTRONIC DEVICE

This application is a national stage filing under 35 U.S.C. § 371 of International Patent Application Serial No. PCT/EP2020/077472, filed Oct. 1, 2020 which claims priority to French patent application FR19/11133, filed Oct. 8, 2019. The contents of these applications are incorporated herein by reference in its entirety.

TECHNICAL BACKGROUND

The present invention generally concerns optoelectronic devices comprising nanometer-range or micrometer-range semiconductor elements, particularly microwires or nanowires, or structures having a pyramidal shape, forming light-emitting diodes and photoluminescent blocks covering the light-emitting diodes.

PRIOR ART

The term "optoelectronic devices" is used to designate devices capable of converting an electric signal into an electromagnetic radiation or conversely, and particularly devices dedicated to detecting, measuring, or emitting an electromagnetic radiation. Electronic devices with three-dimensional semiconductor elements may comprise light-emitting diodes covered with photoluminescent blocks.

A method of manufacturing such optoelectronic devices comprises forming the light-emitting diodes on a substrate and forming the photoluminescent blocks covering the light-emitting diodes. The photoluminescent blocks may be formed by the deposition of a photoluminescent layer on the assembly of light-emitting diodes and the etching of the photoluminescent layer to delimit the photoluminescent blocks.

The delimiting of the photoluminescent blocks in the photoluminescent layer may comprise the deposition of a resin layer covering the photoluminescent layer and the delimiting of portions of the photoluminescent layer by photolithography methods at the desired locations of the photoluminescent blocks. Photolithography methods generally use the detection of visible alignment marks on the substrate to correctly place the masks used for the exposure of the resin layer with the light-emitting diodes.

A disadvantage of such a method is that the photoluminescent layer may be partially opaque to visible light, so that lithography methods using the detection of alignment marks may be difficult to implement.

SUMMARY

Thus, an object of an embodiment is to overcome at least part of the disadvantages of previously-described methods for manufacturing optoelectronic devices comprising light-emitting diodes and photoluminescent blocks.

Another object of an embodiment is to be able to have materials forming the photoluminescent blocks which are not photosensitive materials adapted to a use in photolithography steps.

Another object of an embodiment is to be able to have a significant ratio of the height to the width of the photoluminescent blocks.

Another object of an embodiment is for optoelectronic devices to be capable of being formed at an industrial scale and at a low cost.

An embodiment provides a method of manufacturing an optoelectronic device comprising assemblies of light-emitting diodes having first and second assemblies and first blocks of a first photoluminescent material covering each of the first assemblies. The method comprises forming a layer covering the first and second assemblies, delimiting first openings in the layer to expose the first assemblies, filling the first openings with the first material, and performing a chemical-mechanical polishing to delimit the first blocks.

According to an embodiment, the device comprises second blocks made of a second photoluminescent material, different from the first photoluminescent material, each covering one of the second assemblies, the method comprising delimiting second openings in the layer to expose the second assemblies, filling the second openings with the second material, and performing a chemical-mechanical polishing to delimit the second blocks.

According to an embodiment, the device further comprises third assemblies of light-emitting diodes and third blocks made of a third photoluminescent material, different from the first and second photoluminescent materials, each covering one of the third assemblies, the method comprising delimiting third openings in the layer to expose the third assemblies, filling the third openings with the third material, and performing a chemical-mechanical polishing to delimit the third blocks.

According to an embodiment, the device further comprises fourth assemblies of light-emitting diodes, the method comprising delimiting fourth blocks in the layer, each covering one of the fourth assemblies of light-emitting diodes.

According to an embodiment, the layer is at least partially transparent to the radiation emitted by the light-emitting diodes of the fourth assemblies of light-emitting diodes.

According to an embodiment, the method comprises delimiting fourth openings in the layer between the assemblies and forming walls with reflective sides in the fourth openings.

According to an embodiment, the method comprises depositing a reflective coating in the fourth openings and filling the rest of the fourth openings with a fifth material.

According to an embodiment, the walls are formed after the first photoluminescent blocks.

According to an embodiment, the method comprises forming a barrier layer extending in the fourth openings and covering the first photoluminescent blocks before the forming of the walls.

According to an embodiment, the walls are formed after the first and second photoluminescent blocks.

According to an embodiment, the walls are formed before the first and second photoluminescent blocks.

According to an embodiment, the method comprises etching the layer present between the first, second, and third photoluminescent blocks, forming a barrier layer extending in the fourth openings, and covering the first, second, and third photoluminescent blocks before the forming of the walls, and forming the walls in the spaces present between the first, second, and third photoluminescent blocks.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
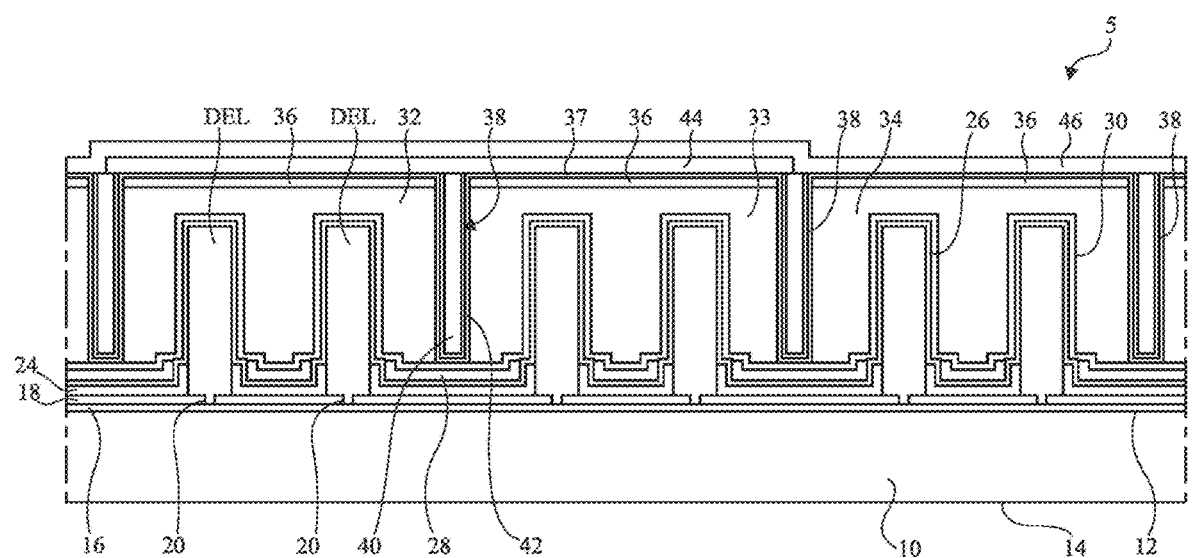
FIG. 1 is a partial simplified cross-section view of an embodiment of an optoelectronic device with light-emitting diodes and photoluminescent blocks.

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an optoelectronic device in a normal position of use. Unless specified otherwise, the expressions "around", "approximately", "substantially" and "in the order of" signify within 10%, and preferably within 5%. When the expressions "about", "approximately", "substantially", and "in the order of" are used in relation with directions, they mean within 10°, preferably within 5°. Further, it is here considered that the terms "insulating" and "conductive" respectively mean "electrically insulating" and "electrically conductive".

The transmittance of a layer corresponds to the ratio of the intensity of the radiation coming out of the layer from an output surface to the intensity of the radiation entering the layer from an input surface opposite to the output surface. In the following description, a layer or a film is called opaque to a radiation when the transmittance of the radiation through the layer or the film is smaller than 10%. In the following description, a layer or a film is called transparent to a radiation when the transmittance of the radiation through the layer or the film is greater than 10%. In the following description, "visible light" designates an electromagnetic radiation having a wavelength in the range from 400 nm to 700 nm.

In the following description, a film or a layer is said to be oxygen-tight when the permeability of the film or of the layer to oxygen at 40° C. is smaller than $1.10^{-1}$ cm$^3$/(m$^2$*day*atm). The permeability to oxygen may be measured according to the ASTM D3985 method entitled "Standard Test Method for Oxygen Gas Transmission Rate Through Plastic Film and Sheeting Using a Coulometric Sensor". In the following description, a film or a layer is said to be water-tight when the permeability of the film or of the layer to water at 40° C. is smaller than $1.10^{-1}$ g/(m$^2$*day). The permeability to water may be measured according to the ASTM F1249 method entitled "Standard Test Method for Water Vapor Transmission Rate Through Plastic Film and Sheeting Using a Modulated Infrared Sensor".

The present invention concerns the manufacturing of optoelectronic devices comprising light-emitting diodes formed based on nanometer- or micrometer-range three-dimensional elements, in particular microwires, nanowires, or pyramids.

The term "microwire" or "nanowire" designates a three-dimensional structure of elongated shape along a preferred direction, having at least two dimensions, called minor dimensions, in the range from 5 nm to 5 µm, preferably from 100 nm to 2 µm, more preferably from 200 nm to 1.5 µm, the third dimension, called major dimension or height, being greater than or equal to 1 time, preferably greater than or equal to 3 times, and more preferably still greater than or equal to 5 times, the largest minor dimension. In certain embodiments, the height of each microwire or nanowire may be greater than or equal to 500 nm, preferably in the range from 1 µm to 50 µm. In the following description, the term "wire" is used to mean "microwire" or "nanowire".

The cross-section of the wires may have different shapes, for example, an oval, circular, or polygonal shape, particularly triangular, rectangular, square, or hexagonal. The term "average diameter" used in relation with a cross-section of a wire designates a quantity associated with the surface area of the wire in this cross-section, for example corresponding to the diameter of the disk having the same surface area as the cross-section of the wire.

In the following description, the term pyramid designates a three-dimensional structure, part of which has a pyramidal or elongated conical shape. The pyramidal structure may be truncated, that is, the top of the cone is absent and replaced with a flat area. The base of the pyramid is inscribed within a square having a side dimension from 100 nm to 10 µm, preferably from 0.2 µm to 2 µm. The polygon forming the base of the pyramid may be a hexagon. The height of the pyramid between the base of the pyramid and the apex or the top plateau varies from 100 nm to 20 µm, preferably from 200 nm to 2 µm.

In the following description, embodiments will be described in the case of an optoelectronic device with light-emitting diodes comprising microwires or nanowires. It should however be clear that these embodiments may concern an optoelectronic device with light-emitting diodes comprising micrometer- or nanometer-range pyramids.

The wires mostly comprise, preferably by more than 60 wt. %, more preferably by more than 80 wt. %, at least one semiconductor material. The semiconductor material may be silicon, germanium, silicon carbide, a III-V compound, a II-VI compound, or a combination of at least two of these compounds.

Examples of group-III elements comprise gallium (Ga), indium (In), or aluminum (Al). Examples of III-N compounds are GaN, AlN, InN, InGaN, AlGaN, or AlInGaN. Other group-V elements may also be used, for example, phosphorus or arsenic. Generally, the elements in the III-V compound may be combined with different molar fractions. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions. The semiconductor material of the wires may comprise a dopant, for example, silicon ensuring an N-type doping of a III-N compound, or magnesium ensuring a P-type doping of a III-N compound.

FIG. 1 is a partial simplified cross-section view of an embodiment of an optoelectronic device 5 comprising microwires or nanowires. Optoelectronic device 5 comprises, from bottom to top in FIG. 1:

a substrate 10 comprising opposite surface 12 and 14, upper surface 12 being preferably planar at least at the level of the light-emitting diodes;

a seed layer 16 made of a material favoring the growth of wires and arranged on surface 12;

an insulating layer 18 covering seed layer 16 and comprising openings 20 exposing portions of seed layer 16;

light-emitting diodes LED (six light-emitting diodes being shown), each light-emitting diode LED being in contact with seed layer 16 through one of openings 20;

an insulating layer 24 extending on the lateral sides of a lower portion of light-emitting diode LED and extending on insulating layer 18 between light-emitting diodes LED;

a layer 26 forming an electrode covering each light-emitting diode LED and further extending on insulating layer 24 between light-emitting diodes LED;

a reflective conductive layer 28, extending on layer 26 between light-emitting diodes LED, where conductive layer 28 may as a variant be interposed between electrode layer 26 and insulating layer 24 between light-emitting diodes LED;

a dielectric protection layer 30 extending on layers 26 and 28;

photoluminescent blocks 32, 33 covering certain assemblies of light-emitting diodes;

blocks 34 transparent to the radiation emitted by the light-emitting diodes and covering other assemblies of light-emitting diodes, which transparent blocks 34 may be omitted;

an insulating layer 36 covering the upper surface of each block 32, 33, 34 or only of some of blocks 32, 33, 34, which insulating layer 36 may be omitted;

a protection layer 37 covering insulating layers 36, the lateral surfaces of blocks 32, 33, 34, and the electrode layer 26 between blocks 32, 34;

walls 38 between blocks 32, 34, each wall 38 comprising a core 40 surrounded with a reflective coating 42;

one, two, or three color filters 44, for example, a single yellow filter, two filters, the first one being a yellow filter and the second one being a red filter, or three filters, the first one being a red filter, the second one being a green filter, and the third one being a blue filter, covering at least some of photoluminescent blocks 32, 33, a single filter 44 covering two blocks being shown as an example; and a transparent protection layer 46 covering the entire structure.

Figure 2:
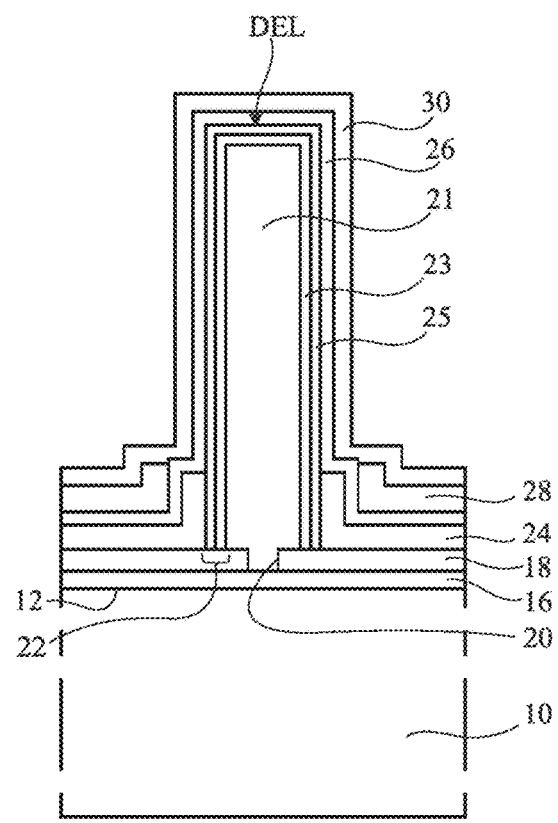
FIG. 2 is a partial simplified cross-section view of an embodiment of a light-emitting diode.

FIG. 2 shows an embodiment of light-emitting diodes LED. According to an embodiment, each light-emitting diode LED comprises a wire 21 in contact with seed layer 16 through one of openings 20 and a shell 22 comprising a stack of semiconductor layers covering the lateral walls and the top of wire 21. The assembly formed by each wire 21 and the associated shell 22 forms a light-emitting diode LED.

Shell 22 may comprise a stack of a plurality of layers particularly comprising an active layer 23 and a bonding layer 25. Active layer 23 is the layer from which most of the radiation supplied by light-emitting diode LED is emitted. According to an example, active layer 23 may comprise confinement means, such as multiple quantum wells. Bonding layer 25 may comprise a stack of semiconductor layers of the same III-V material as wire 21 but having a conductivity type opposite to that of wire 21.

Substrate 10 may correspond to a monoblock structure or may correspond to a layer covering a support made of another material. Substrate 10 is preferably a semiconductor substrate, for example, a substrate made of silicon, of germanium, of silicon carbide, of a III-V compound, such as GaN or GaAs, or a ZnO substrate. Preferably, substrate 10 is a single-crystal silicon substrate. Preferably, it is a semiconductor substrate compatible with the manufacturing methods implemented in microelectronics. Substrate 10 may correspond to a multilayer structure of silicon-on-insulator type, also called SOI.

The cross-section of openings 20 may correspond to the desired cross-section of wires 21 or may be different from the cross-section of the wires that will be obtained. The average diameter of wires 21 may be equal to or greater than the average diameter of openings 20.

Seed layer 16 is made of a material favoring the growth of wires. As an example, the material forming seed layer 16 may be a nitride, a carbide, or a boride of a transition metal from column IV, V, or VI of the periodic table of elements or a combination of these compounds. As an example, seed layer 16 may be made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB$_2$), of zirconium nitride (ZrN), of silicon carbide (SiC), of tantalum carbide nitride (TaCN), of magnesium nitride in Mg$_x$N$_y$ form, where x is approximately equal to 3 and y is approximately equal to 2, for example, magnesium nitride according to form Mg$_3$N$_2$ or magnesium gallium nitride (MgGaN), of tungsten (W), of tungsten nitride (WN), or of a combination thereof. Seed layer 16 may have a monolayer structure or may correspond to a stack of at least two layers, each layer being for example made of one of the previously-described materials.

According to an embodiment, seed layer 16 may be omitted. According to another embodiment, seed layer 16 may be replaced with seed pads, for example, formed at the bottom of openings 20.

Each insulating layer 18, 24, 30, 36, 37, 46 and filling material 40 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (particularly of general formula SiO$_x$N$_y$, for example, Si$_2$ON$_2$), of aluminum oxide (Al$_2$O$_3$), of hafnium oxide (HfO$_2$), of titanium dioxide (TiO$_2$), or of diamond. Insulating layer 18, 24, 30, 36, 37, 46 may have a monolayer structure or may correspond to a stack of two layers or of more than two layers. When insulating layer 18 corresponds to a stack of at least two layers, the upper layer of the stack is of insulating type, for example, made of a dielectric material.

Conductive layer 28 or coating 42 preferably corresponds to a metal layer, for example, aluminum, silver, copper, gold, or zinc. The thickness of conductive layer 28 or of coating 42 may be in the range from 0.01 μm to 1,000 μm. As a variant, coating 42 may be omitted. In this case, filling material 40 may be a metallic material, for example, aluminum, silver, copper, or zinc.

Electrode layer 26 is capable of giving way to the electromagnetic radiation emitted by the light-emitting diodes. The material forming electrode layer 26 may be a transparent and conductive material such as indium tin oxide (ITO), aluminum or gallium zinc oxide, or graphene. The thickness of electrode layer 26 may be in the range from 0.01 μm to 10 μm.

According to an embodiment, each photoluminescent block 32, 33 is located opposite one of the light-emitting diodes or an assembly of light-emitting diodes. Each photoluminescent block 32, 33 comprises luminophores capable, when they are excited by the light emitted by the associated light-emitting diode LED, of emitting light at a wavelength different from the wavelength of the light emitted by the associated light-emitting diode LED. According to an embodiment, optoelectronic device 5 comprises at least two types of photoluminescent blocks 32, 33. Each photoluminescent block 32 of the first type is capable of converting the radiation supplied by the light-emitting diodes into a first radiation at a first wavelength, and each photoluminescent block 33 of the second type is capable of converting the radiation supplied by the light-emitting diodes that it covers into a second radiation at a second wavelength. According to an embodiment, optoelectronic device 5 comprises at least three types of photoluminescent blocks 32, 33, each photoluminescent block of the third type being capable of converting the radiation supplied by the light-emitting diodes LED into a third radiation at a third wavelength. The first, second, and third wavelengths may be different.

According to an embodiment, the light-emitting diodes are capable of emitting blue light, that is, a radiation having its wavelength in the range from 430 nm to 480 nm. According to an embodiment, the first wavelength corresponds to green light and is in the range from 510 nm to 570 nm. According to an embodiment, the second wavelength corresponds to red light and is in the range from 600 nm to 720 nm.

According to another embodiment, light-emitting diodes LED are for example capable of emitting an ultraviolet radiation. According to an embodiment, the first wavelength corresponds to blue light and is within the range from 430 nm to 480 nm. According to an embodiment, the second wavelength corresponds to green light and is within the range from 510 nm to 570 nm. According to an embodiment, the third wavelength corresponds to red light and is within the range from 600 nm to 720 nm.

The aspect ratio of blocks 32, 33, that is, the ratio of the height to the maximum width of the block, may be in the range from 0.01 to 10, preferably from 0.05 to 2.

According to an embodiment, each photoluminescent block 32, 33 comprises particles of at least one photoluminescent material, for example, in a transparent matrix. An example of a photoluminescent material is yttrium aluminum garnet (YAG) activated by the trivalent cerium ion, also called YAG:Ce or YAG:Ce$^{3+}$. The average size of the particles of conventional photoluminescent materials is generally greater than 5 µm.

According to an embodiment, each photoluminescent block 32, 33 comprises a matrix having nanometer-range monocrystalline particles of a semiconductor material, also called semiconductor nanocrystals or nano-luminophore particles hereafter, dispersed therein. The internal quantum efficiency $QY_{int}$ of a photoluminescent material is equal to the ratio of the number of emitted photons to the number of photons absorbed by the photoluminescent substance. The internal quantum efficiency $QY_{int}$ of the semiconductor nanocrystals is greater than 5%, preferably greater than 10%, more preferably greater than 20%.

According to an embodiment, the average size of the nanocrystals is in the range from 0.5 nm to 1,000 nm, preferably from 0.5 nm to 500 nm, more preferably from 1 nm to 100 nm, particularly from 2 nm to 30 nm. For dimensions smaller than 50 nm, the photoconversion properties of semiconductor nanocrystals essentially depend on quantum confinement phenomena. The semiconductor nanocrystals then correspond to quantum dots.

According to an embodiment, the semiconductor material of the semiconductor crystals is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), cadmium zinc selenide (CdZnSe), silver indium sulfide (AgInS$_2$), perovskites of PbScX$_3$ type where X is a halogen atom, particularly iodine (I), bromine (Br), or chlorine (Cl), and a mixture of at least two of these compounds. According to an embodiment, the semiconductor material of the semiconductor nanocrystals is selected from the materials mentioned in Le Blevenec et al.'s publication in Physica Status Solidi (RRL)—Rapid Research Letters Volume 8, No. 4, pages 349-352, April 2014.

According to an embodiment, the dimensions of the semiconductor nanocrystals are selected according to the desired wavelength of the radiation emitted by the semiconductor nanocrystals. As an example, CdSe nanocrystals having an average size in the order of 3.6 nm are capable of converting blue light into red light and CdSe nanocrystals having an average size in the order of 1.3 nm are capable of converting blue light into green light. According to another embodiment, the composition of the semiconductor nanocrystals is selected according to the desired wavelength of the radiation emitted by the semiconductor nanocrystals.

The matrix is at least partly transparent to the radiation emitted by the photoluminescent particles and/or light-emitting diodes LED, preferably by more than 80%. The matrix is for example made of silica. The matrix is for example made of any at least partly transparent polymer, particularly of silicone, of acrylic resin or poly(methyl methacrylate) (PMMA) type or of polylactic acid (PLA). The matrix may in particular be made of an at least partly transparent polymer used with three-dimensional printers. The matrix may correspond to photosensitive or non-photosensitive glass deposited by centrifugation (SOG, Spin-On Glass). According to an embodiment, the matrix contains from 2% to 90%, preferably from 10 wt. % to 60 wt. %, of nanocrystals, for example, approximately 30 wt. % of nanocrystals.

The thickness of photoluminescent blocks 32, 33 depends on the nanocrystal concentration and on the type of nanocrystals used. The height of photoluminescent blocks 32, 33 is preferably greater than the height of wires 21 and smaller than or equal to the height of walls 38. In top view, each photoluminescent bloc 32, 33 may correspond to a square, a rectangle, an "L"-shaped polygon, etc. having an area that may be equal to the area of a square having a side length from 1 µm to 100 µm, preferably from 3 µm to 15 µm.

Walls 38 are at least partly made of at least one reflective material. The reflective material may be a metallic material, particularly iron, copper, aluminum, tungsten, silver titanium, hafnium, zirconium, or a combination of at least two of these compounds. Preferably, walls 38 are made of a material compatible with manufacturing methods implemented in microelectronics. Preferably, walls 38 are made of aluminum or of silver.

The height of walls 38, measured along a direction perpendicular to surface 12, is in the range from 300 nm to 200 µm, preferably from 3 µm to 15 µm. The thickness of walls 38, measured along a direction parallel to surface 12, is in the range from 100 nm to 50 µm, preferably from 0.5 µm to 10 µm.

According to an embodiment, walls 38 may be made of a reflective material or covered with a coating which is reflective at the wavelength of the radiation emitted by photoluminescent blocks 32, 33 and/or the light-emitting diodes.

Preferably, walls 38 surround photoluminescent blocks 32, 33. Walls 38 then decrease the crosstalk between adjacent photoluminescent blocks 32, 33.

Encapsulation layer 46 is at least partly transparent to the radiation emitted by the photoluminescent particles and/or light-emitting diodes LED. The encapsulation layer may be made of an inorganic material at least partly transparent to the radiation emitted by the photoluminescent particles and/or light-emitting diodes LED. As an example, the inorganic material is selected from the group comprising silicon oxides of SiO$_x$ type, where x is a real number between 1 and 2 or SiO$_y$N$_z$, where y and z are real numbers between 0 and 1, titanium oxide, aluminum oxides, for example, Al$_2$O$_3$, and mixtures of these compounds. The encapsulation layer may be made of an at least partially transparent organic material. As an example, the encapsulation layer is a silicone polymer, an epoxide polymer, an acrylic polymer, or a polycarbonate. Encapsulation layer 46 may have a monolayer or multilayer structure and may for example comprise a stack of organic and/or inorganic layers.

FIGS. 3 to 14 illustrate the structures obtained at successive steps of an embodiment of a method of manufacturing the optoelectronic device 5 shown in FIG. 1.

Figure 3:
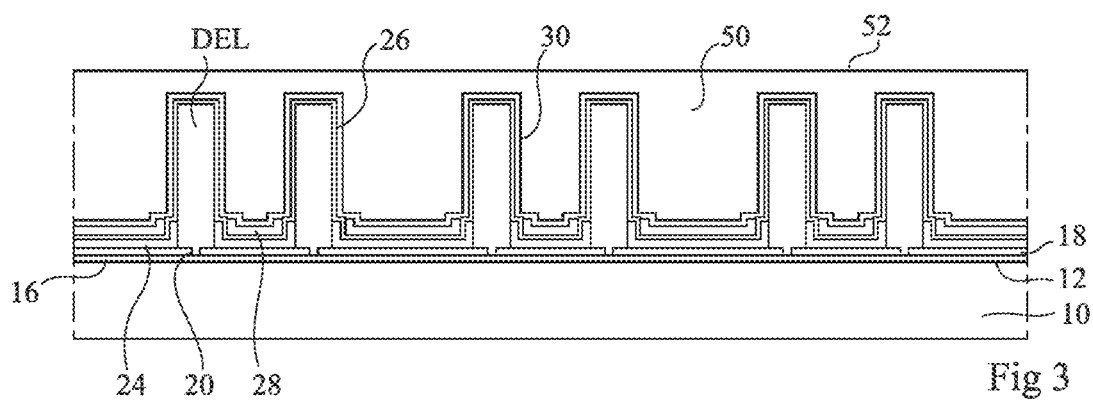
FIG. 3 is a cross-section view of the structure obtained at a step of an embodiment of a method of manufacturing the device of FIG. 1.

FIG. 3 illustrates the structure obtained after the forming of seed layer 16 on surface 12 of substrate 10, the forming of insulating layer 18 on seed layer 16, the etching of openings 20 in insulating layer 18, the forming of light-emitting diodes LED, that is, the growth of the wires in openings 20, for example, by metal-organic chemical vapor deposition (MOCVD) or any other adapted method, and the forming of the shells covering the wires, the forming of insulating layer 24 at the foot of each light-emitting diode LED, the forming of electrode layer 26, the forming of conductive layer 28, the forming of dielectric layer 30, and the deposition of a layer 50 of a material transparent to visible light, particularly a dielectric material, filling the spaces between wires 21 to form a substantially planar upper surface 52 above dielectric layer 30. Layer 50 may be made of a mineral material transparent in the visible range, $SiO_2$, SiN, $Al_2O_3$. Layer 50 may be made of resin, particularly of resist. Layer 50 may be deposited by spin coating, slot-die coating, blade coating, flexography, or silk-screening.

Figure 4:
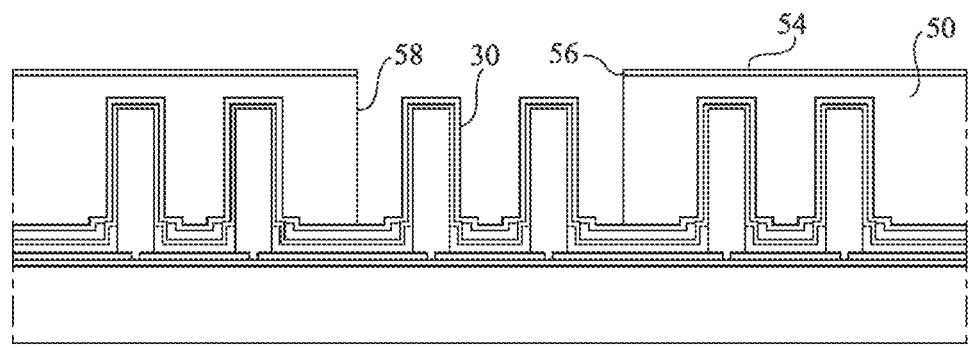
FIG. 4 is a cross-section view of the structure obtained at another step of the method.

FIG. 4 shows the structure obtained after the deposition of a layer 54, used as an etch mask, on transparent layer 50 and, at each desired location of a photoluminescent block 32 of the first type, the etching of an opening 56 in layer 54 and of an opening 58, continuing opening 56, in transparent layer 50 across the entire thickness of transparent layer 50. Layer 54 may made of one of the materials previously described for insulating layer 18, 24, 30, 36, 37, 46. The etching of insulating layer 54 may be a dry etching, for example, of ion plasma type, or a wet etching, preferably selective over the material of transparent layer 50. In the case where layer 50 is made of $SiO_2$, layer 54 may be a resist and may be removed after the forming of opening 58. The etching of transparent 50 may be a dry etching, for example, of ion plasma type, preferably selective over protection layer 30.

Figure 5:
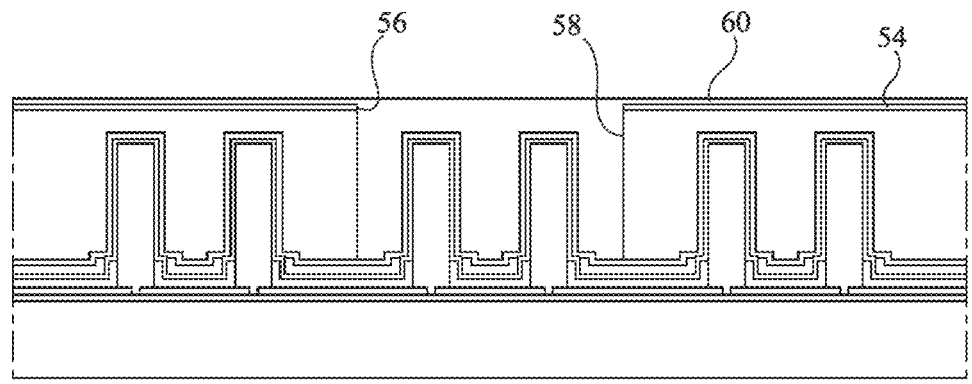
FIG. 5 is a cross-section view of the structure obtained at another step of the method.

FIG. 5 shows the structure obtained after having totally filled openings 56, 58 with the material forming the photoluminescent blocks 32 of the first type. It may be a spin coating or a slot-die coating. The filling step causes the forming of a layer 60 of the material forming photoluminescent locks 32 on insulating layer 54.

Figure 6:
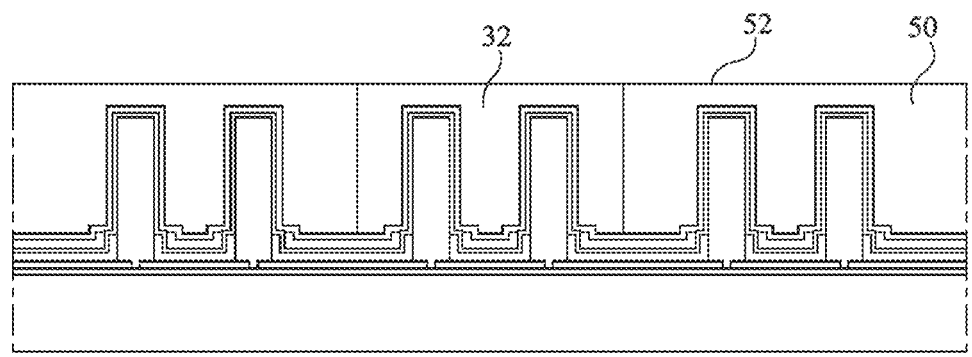
FIG. 6 is a cross-section view of the structure obtained at another step of the method.

FIG. 6 shows the structure obtained after a step of etching, particularly, of chemical-mechanical polishing, also called CMP, to remove layer 60 and insulating layer 54 in order to expose the upper surface 52 of transparent layer 50. The chemical-mechanical polishing step may comprise, simultaneously or successively, steps of mechanical polishing and steps of chemical etching. According to an embodiment, layer 60 may be removed by CMP, layer 54 then being used as an etch stop layer. Layer 54 may then be removed, for example, by dry etching, particularly plasma etching, or by wet etching. Photoluminescent blocks 32 are thus delimited. As a variant, layer 54 may not be removed.

Figure 7:
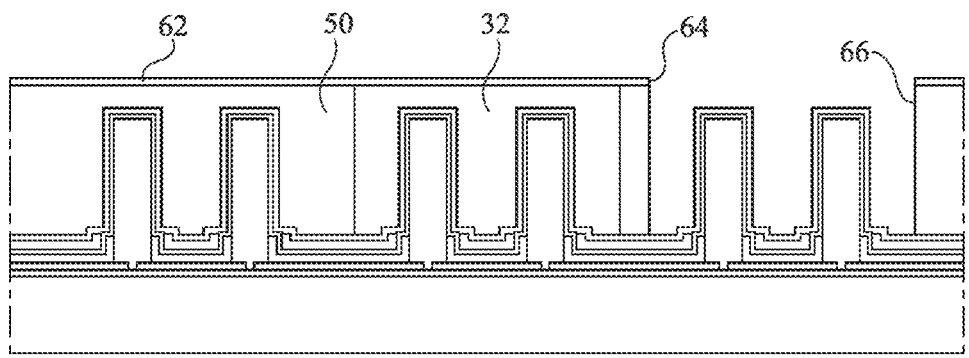
FIG. 7 is a cross-section view of the structure obtained at another step of the method.

FIG. 7 shows the structure obtained after the deposition of layer 62, used as an etch mask, on transparent layer 50 and, at each desired location of a photoluminescent block 33 of the second type, the etching of an opening 64 in layer 62 and of an opening 66, continuing opening 64, in transparent layer 50 across the entire thickness of transparent layer 50. Layer 62 may be made of one of the materials previously described for insulating layer 18, 24, 30, 36, 37, 46, 56.

Figure 8:
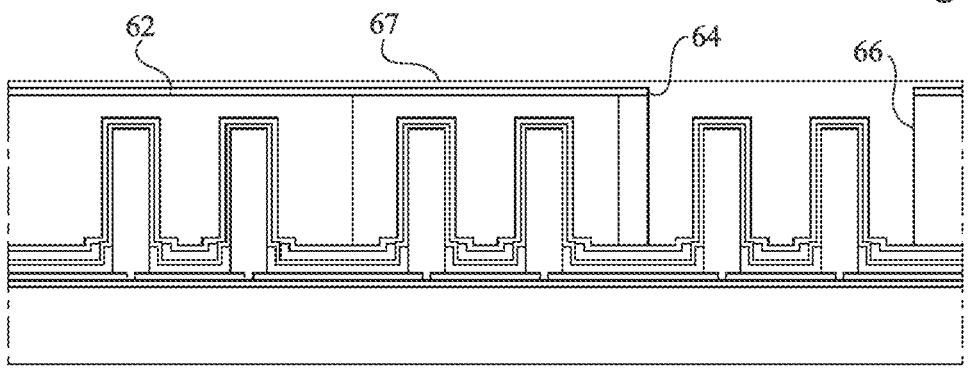
FIG. 8 is a cross-section view of the structure obtained at another step of the method.

FIG. 8 shows the structure obtained after having totally filled openings 64, 66 with the material forming the photoluminescent blocks 33 of the second type. It may be a spin coating or a slot-die coating. The filling step causes the forming of a layer 67 of the material forming photoluminescent blocks 33 on transparent layer 50.

Figure 9:
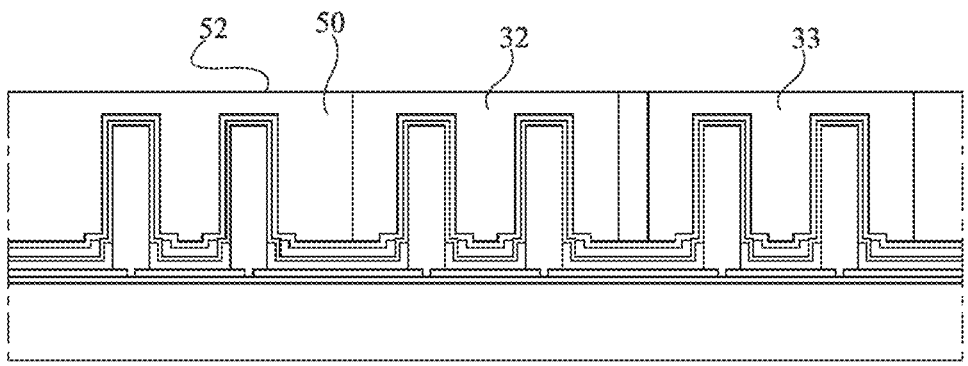
FIG. 9 is a cross-section view of the structure obtained at another step of the method.

FIG. 9 shows the structure obtained after a CMP step to remove layer 67 and insulating layer 62 in order to expose the upper surface 52 of transparent layer 50. Photoluminescent blocks 33 are thus delimited. As a variant, layer 67 may be removed by CMP, layer 62 then being used as an etch stop layer. Layer 62 may then be removed, for example, by dry etching, particularly plasma etching, or by wet etching. As a variant, layer 62 may not be removed.

Figure 10:
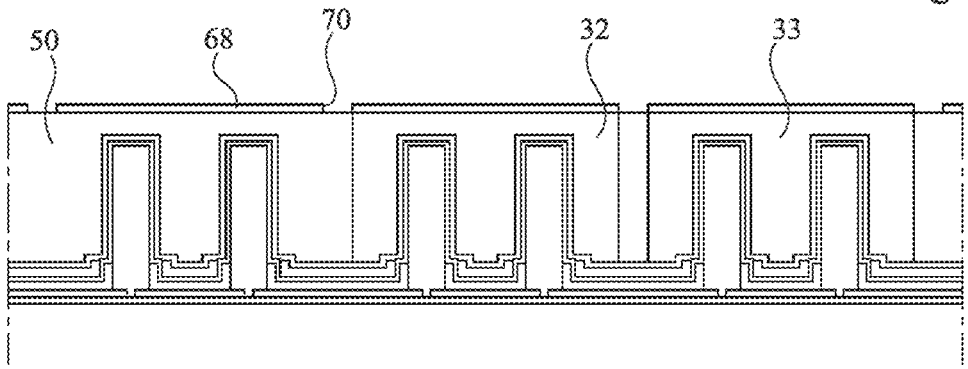
FIG. 10 is a cross-section view of the structure obtained at another step of the method.

FIG. 10 shows the structure obtained after the deposition of a layer 68, used as an etch mask, on transparent layer 50 and photoluminescent blocks 32, 33 and, at each desired location of a wall 38, the etching of an opening 70 in layer 68.

Figure 11:
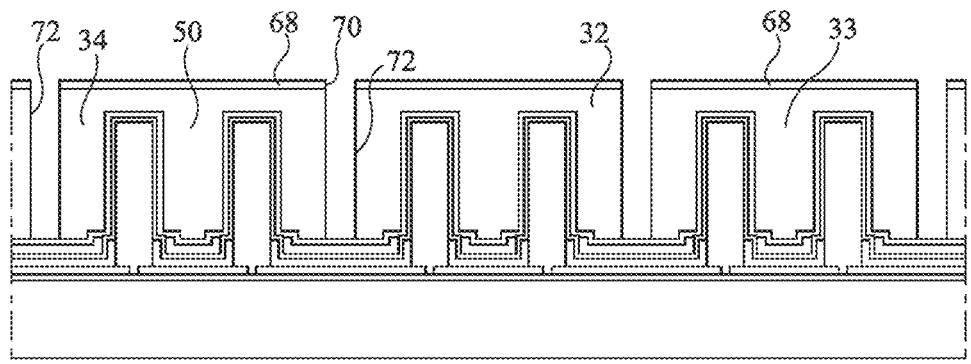
FIG. 11 is a cross-section view of the structure obtained at another step of the method.

FIG. 11 shows the structure obtained after the etching, for each opening 70, of an opening 72, continuing opening 70, in transparent layer 50, across the entire thickness of transparent layer 50. Layer 68 may then be kept or not. The remaining portions of transparent layer 50 form transparent blocks 34. In the case where layer 50 is made of $SiO_2$, layer 68 may be a resist layer and may be removed after the forming of opening 72.

Figure 12:
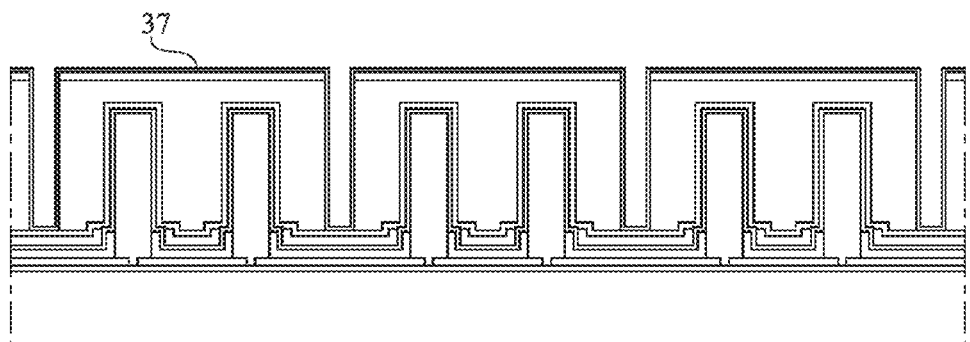
FIG. 12 is a cross-section view of the structure obtained at another step of the method.

FIG. 12 shows the structure obtained after the deposition of insulating layer 37 over the entire structure shown in FIG. 11. Insulating layer 37 may be deposited by a conformal deposition method, particularly an atomic layer deposition (ALD) method. Insulating layer 37 may in particular be a layer tight to humidity and/or to air and may play the role of a protection layer for photoluminescent blocks 32, 33. Advantageously, layer 37 is deposited just after the forming of photoluminescent blocks 32, 33.

Figure 13:
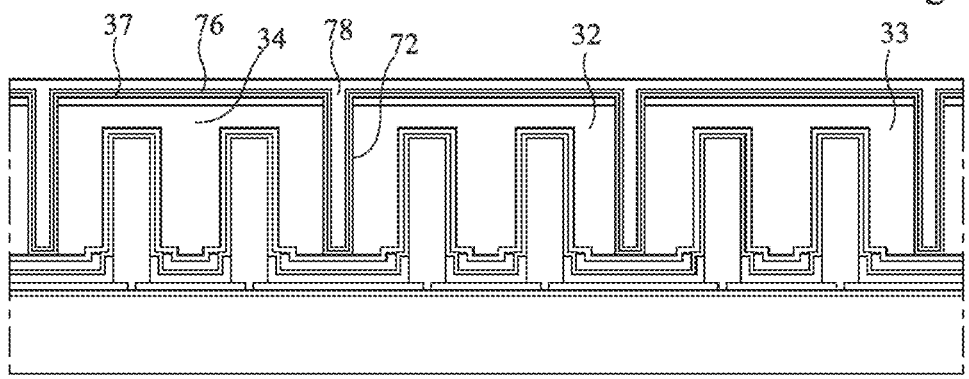
FIG. 13 is a cross-section view of the structure obtained at another step of the method.

FIG. 13 shows the structure obtained after the deposition, over the entire structure shown in FIG. 12, of a layer 76 made of the material forming coatings 42 of walls 38, and after the filling of openings 72 with the material forming the cores 40 of walls 38, which causes the forming of a layer 78 of the filling material on blocks 32, 33, 34.

Figure 14:
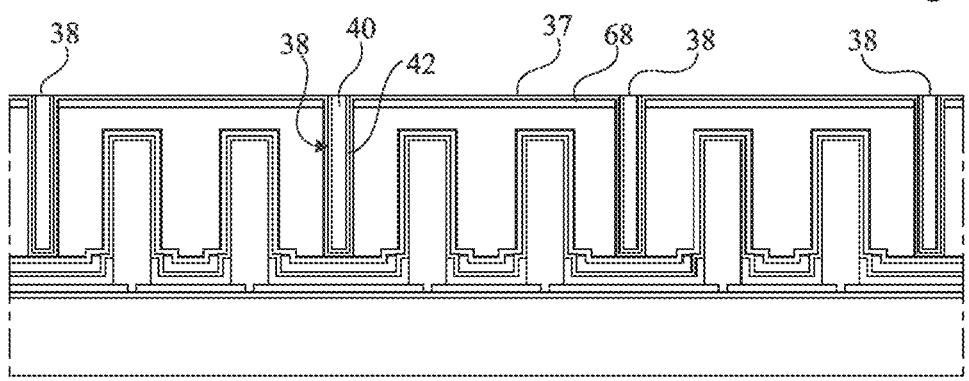
FIG. 14 is a cross-section view of the structure obtained at another step of the method.

FIG. 14 shows the structure obtained after an etch step, to remove the portions of layer 78 of the filling material and the portions of layer 76 located outside of openings 72 to expose the portions of insulating layer 37 covering the portions of insulating layer 68, thus delimiting walls 38, particularly, cores 40 and coatings 42. As an example, the portions of layer 78 outside of openings 72 may be removed by dry etching and the portions of layer 76 located outside of openings 72 may be removed by wet or dry etching.

The method comprises additional steps of forming of color filters 44 and of protection layer 46.

FIGS. 15 to 27 illustrate the structures obtained at successive steps of another embodiment of a method of manufacturing optoelectronic device 5.

Figure 15:
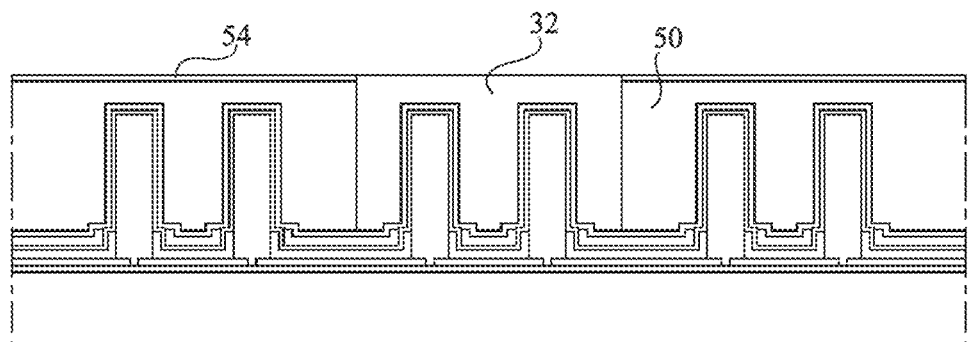
FIG. 15 is a cross-section view of the structure obtained at a step of another embodiment of a method of manufacturing the device of FIG. 1.

FIG. 15 illustrates the structure obtained after steps identical to those previously described in relation with FIGS. 3, 4, 5, and 6, with the difference that, at the CMP step, insulating layer 54 is not removed.

Figure 16:
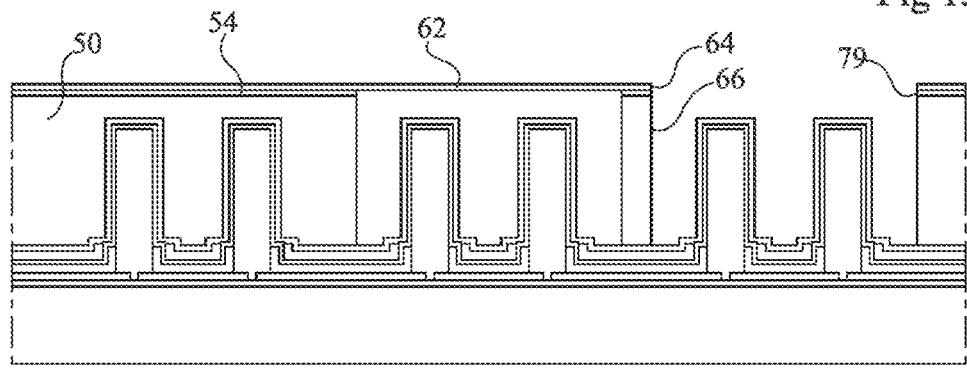
FIG. 16 is a cross-section view of the structure obtained at another step of the method.

FIG. 16 shows the structure obtained after the deposition of layer 62, used as an etch mask, over the entire structure and, at each desired location of a photoluminescent block 33 of the second type, the etching of an opening 64 in layer 62, of an opening 79 in layer 54 continuing opening 64, and of opening 66, continuing opening 64, in transparent layer 50 across the entire thickness of transparent layer 50.

Figure 17:
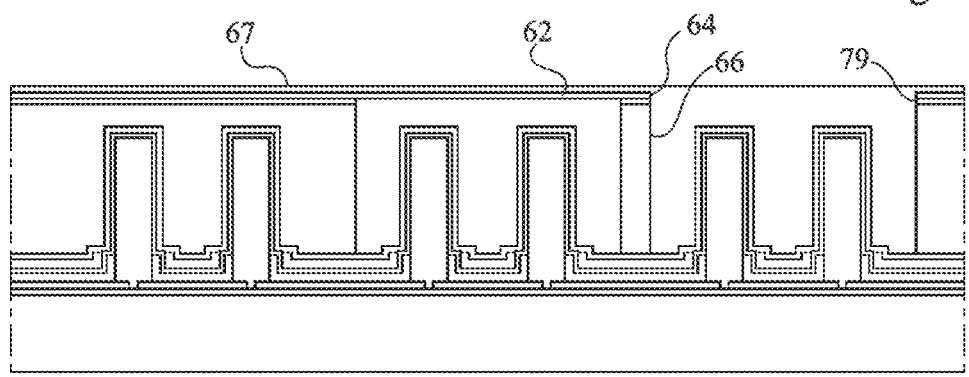
FIG. 17 is a cross-section view of the structure obtained at another step of the method.

FIG. 17 shows the structure obtained after steps similar to those previously described in relation with FIG. 8, that is, after having totally filled openings 64, 79, 66 with the material forming the photoluminescent blocks 33 of the second type. It may be a spin coating. The filling step causes the forming of layer 67 of the material forming photoluminescent blocks 33 on insulating layer 62.

Figure 18:
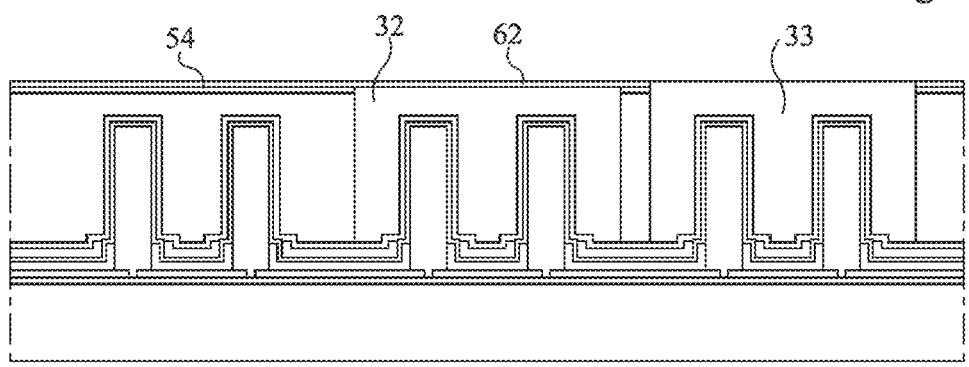
FIG. 18 is a cross-section view of the structure obtained at another step of the method.

FIG. 18 shows the structure obtained after a CMP step to remove layer 67 to reach the insulating layer 62 which is not removed. Photoluminescent blocks 33 are thus delimited.

Figure 19:
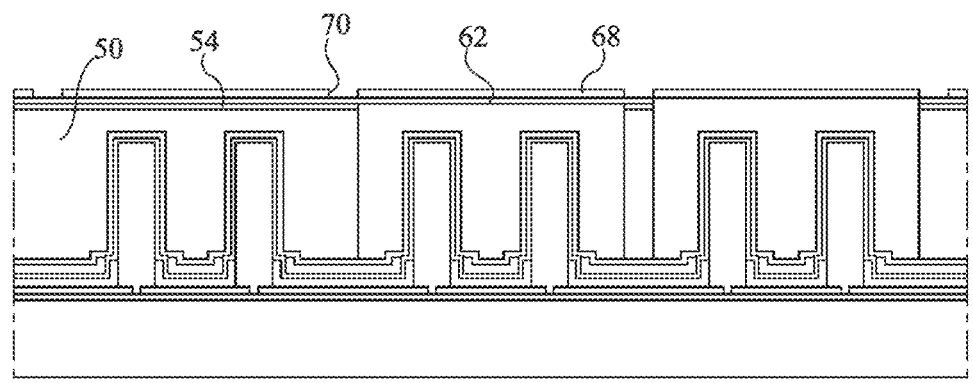
FIG. 19 is a cross-section view of the structure obtained at another step of the method.
Figure 20:
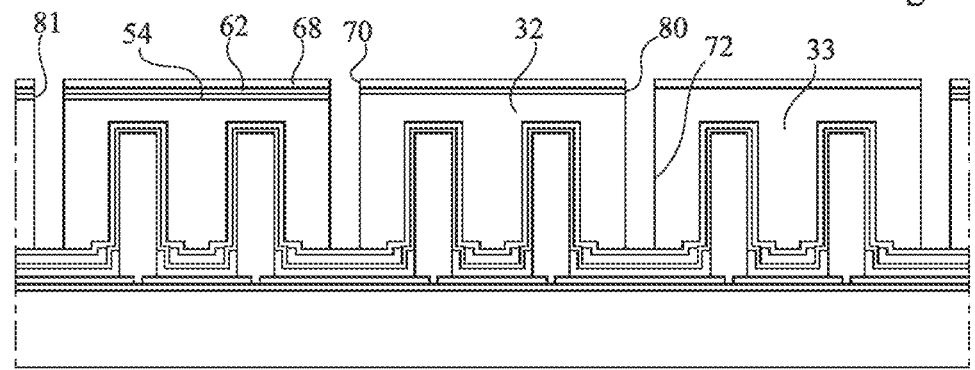
FIG. 20 is a cross-section view of the structure obtained at another step of the method.

FIGS. 19 and 20 illustrates steps similar to the steps previously described in relation with FIGS. 10 and 11 and show the structure obtained after the deposition of layer 68, used as an etch mask, over the entire structure and, at each desired location of a wall 38, the etching of an opening 70 in layer 68, possibly of an opening 80 in layer 62 continuing opening 70, of an opening 81 in layer 54 continuing opening 70, and the etching of opening 72, continuing opening 70, in transparent layer 50 across the entire thickness of transparent layer 50.

Figure 21:
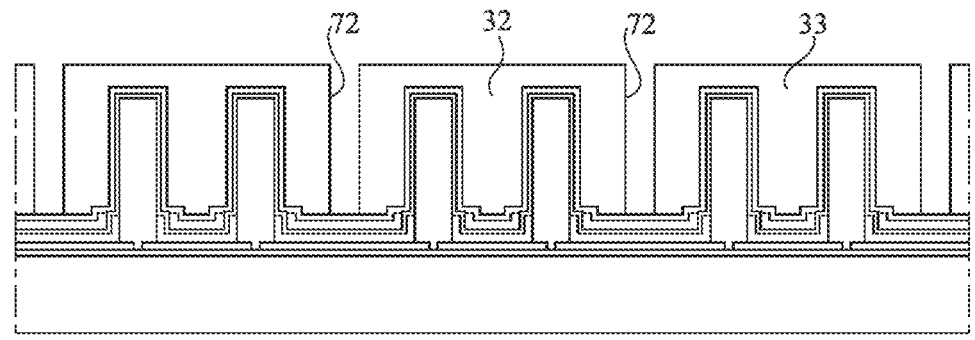
FIG. 21 is a cross-section view of the structure obtained at another step of the method.

FIG. 21 shows the structure obtained after a CMP step to remove insulating layer 54, 62, and 68. This step may be omitted.

Figure 22:
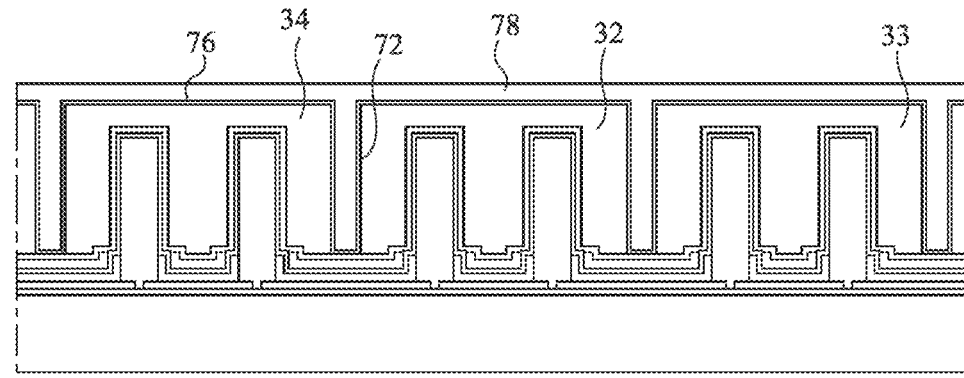
FIG. 22 is a cross-section view of the structure obtained at another step of the method.

FIG. 22 shows the structure obtained after steps similar to the steps previously described in relation with FIG. 13 and comprising the deposition, over the entire structure shown in FIG. 21, of insulating layer 76 made of the material forming the coatings 42 of walls 38 and after the filling of openings 72 with the material forming the cores 40 of walls 38, which causes the forming of layer 78 of the filling material on blocks 32, 33, 34.

Figure 23:
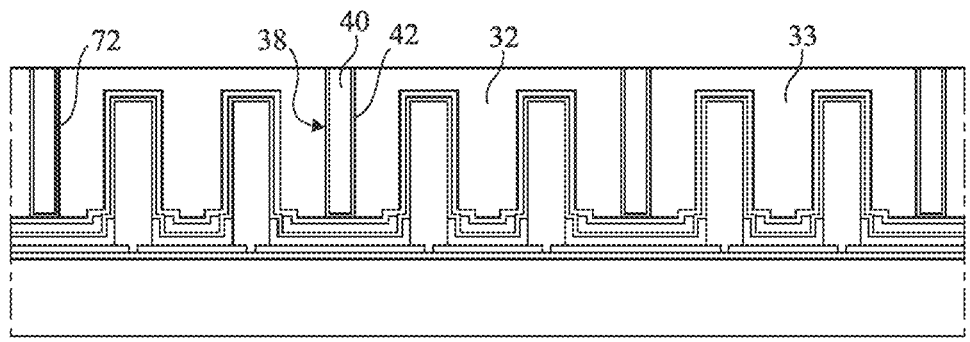
FIG. 23 is a cross-section view of the structure obtained at another step of the method.

FIG. 23 shows the structure obtained after a step of CMP or dry etching to remove layer 78 of the filling material and the portions of layer 76 located outside of openings 72 to expose the portions of insulating layer 37 covering insulating layers 36, thus delimiting walls 38.

Figure 24:
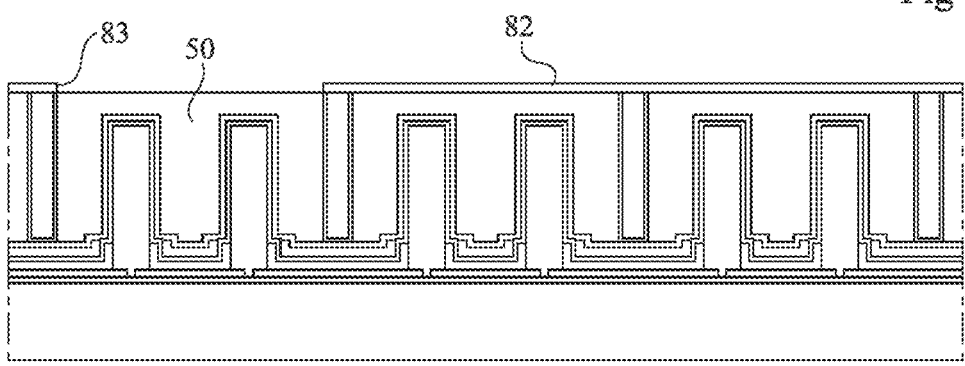
FIG. 24 is a cross-section view of the structure obtained at another step of the method.

FIG. 24 shows the structure obtained after the deposition of a layer 82, used as an etch mask, over the entire structure and, at each desired location of a photoluminescent block of a third type, the etching of an opening 83 in layer 82.

Figure 25:
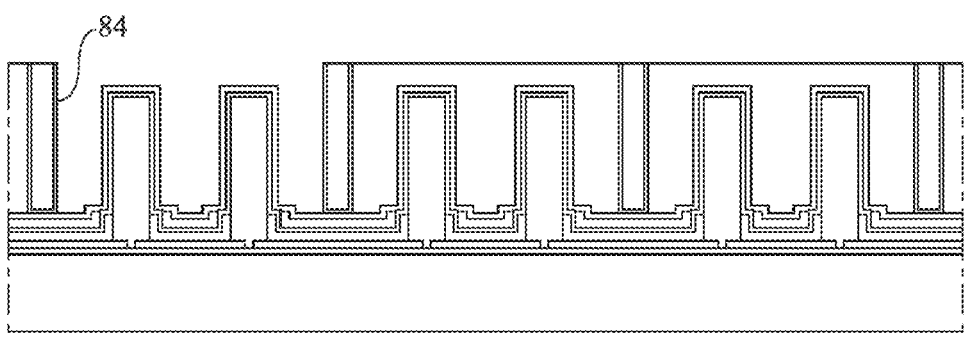
FIG. 25 is a cross-section view of the structure obtained at another step of the method.

FIG. 25 shows the structure obtained after the etching of an opening 84, continuing opening 82 in transparent layer 50 across the entire thickness of transparent layer 50 and after having removed layer 80.

Figure 26:
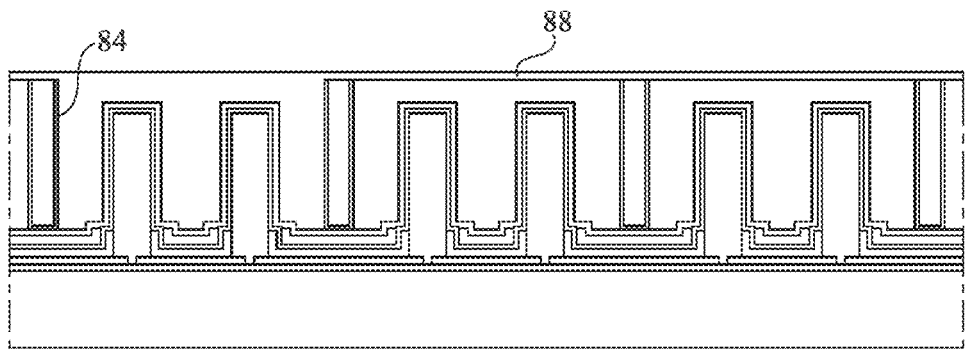
FIG. 26 is a cross-section view of the structure obtained at another step of the method.

FIG. 26 shows the structure obtained after having totally filled openings 84 with the material forming the photoluminescent blocks of the third type. It may be a spin coating. The filling step causes the forming of a layer 88 of the material forming the photoluminescent blocks on the rest of the structure outside of openings 84.

Figure 27:
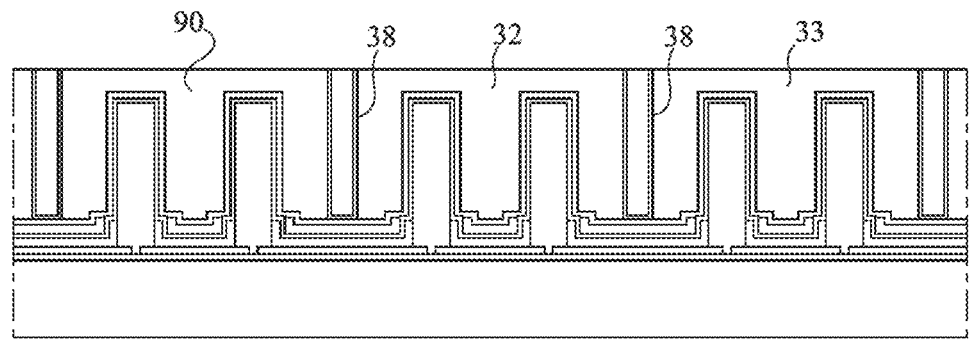
FIG. 27 is a cross-section view of the structure obtained at another step of the method.

FIG. 27 shows the structure obtained after a CMP step to remove layer 88. Photoluminescent blocks 90 of the third type are thus delimited. In the case where there are no transparent blocks 34, as previously described, covering light-emitting diodes LED, it is not necessary for layer 50 to be made of a strongly transparent material, since there are not further portions of layer 50 covering light-emitting diodes at the end of the manufacturing method.

The method comprises additional steps of forming of color filters 44 and of protection layer 46.

FIGS. 28 to 31 illustrate the structures obtained at successive steps of another embodiment of a method of manufacturing optoelectronic device 5.

The initial steps of the method comprise all the steps previously described in relation with FIGS. 3 to 18.

Figure 28:
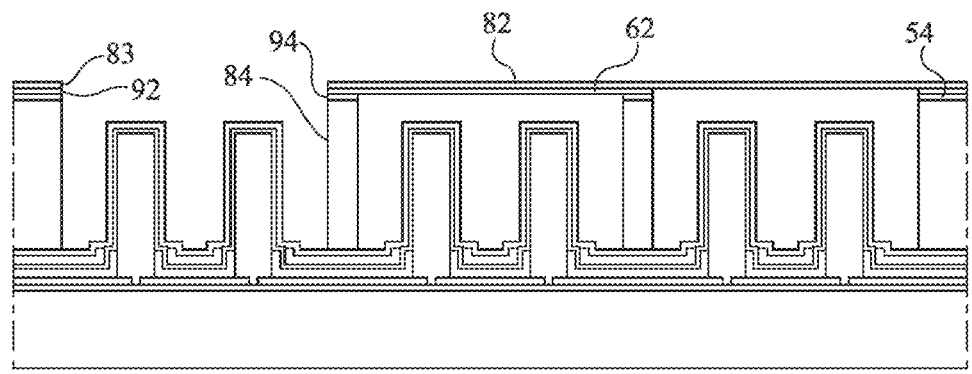
FIG. 28 is a cross-section view of the structure obtained at a step of another embodiment of a method of manufacturing the device of FIG. 1.

FIG. 28 shows the structure obtained after the deposition of layer 82, used as an etch mask, over the entire structure and, at each desired location of a photoluminescent block 90 of the third type, the etching of opening 83 in layer 82, of an opening 92 in the layer 62 continuing opening 83, of an opening 94 in layer 54 continuing opening 83, and the etching of opening 84, continuing opening 83 in layer 50, across the entire thickness of layer 50.

Figure 29:
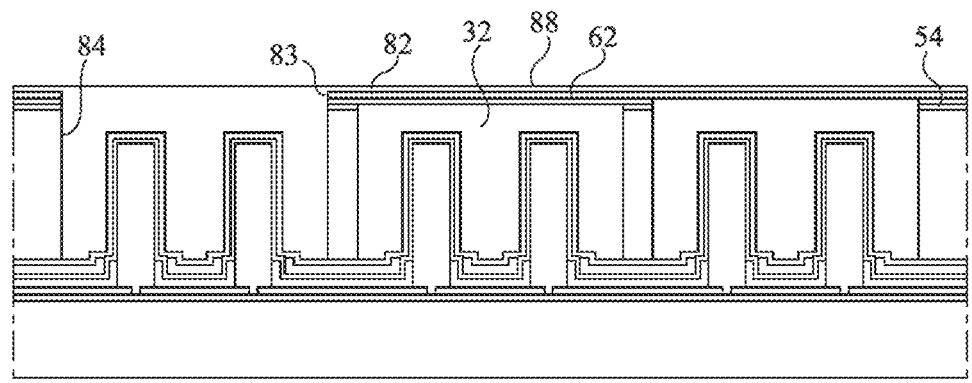
FIG. 29 is a cross-section view of the structure obtained at another step of the method.

FIG. 29 shows the structure obtained after having totally filled openings 84 with the material forming the photoluminescent blocks 90 of the third type. It may be a spin coating. The filling step causes the forming of layer 88 of the material forming photoluminescent blocks 90 on the rest of the structure outside of openings 84.

Figure 30:
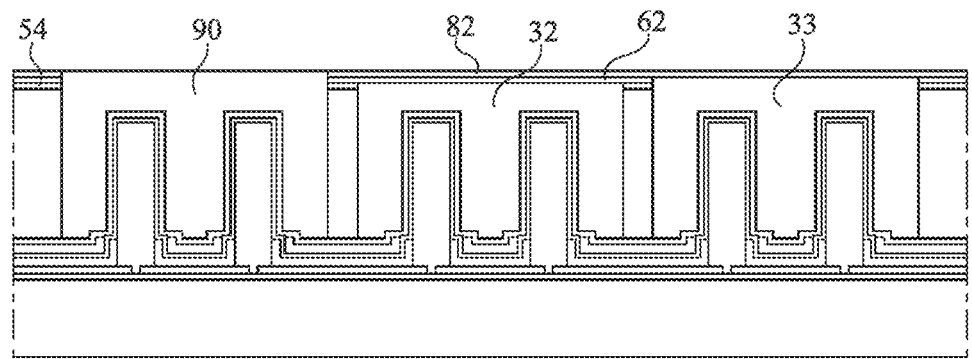
FIG. 30 is a cross-section view of the structure obtained at another step of the method.

FIG. 30 shows the structure obtained after a CMP step to remove layer 88. The photoluminescent blocks 90 of the third type are thus delimited.

In the previously-described embodiments, the steps of forming of openings 58, 66, 84 in layer 50 comprise the use of etch masks. According to another embodiment, the steps of etching of the openings in layer 50 may be directly carried out by photolithography steps when layer 50 is made of resist.

Figure 31:
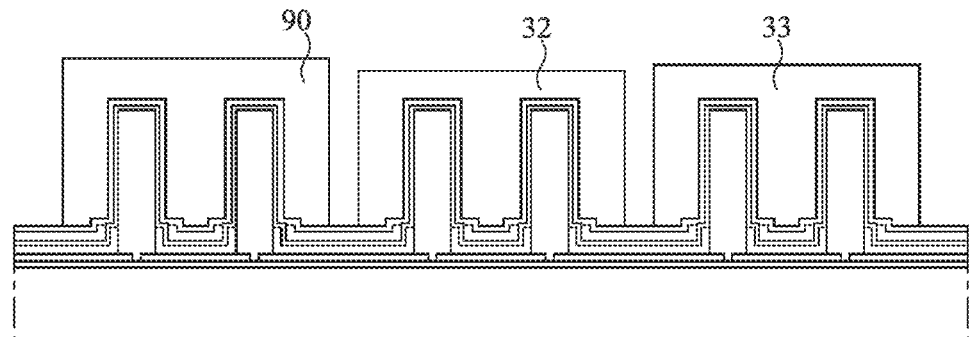
FIG. 31 is a cross-section view of the structure obtained at another step of the method.

FIG. 31 shows the structure obtained after a step of selective etching to remove mask layers 54, 62, 82 and to remove the portions of transparent layer 50 remaining between photoluminescent blocks 32, 33, 90.

The method may then comprise the steps previously described in relation with FIGS. 13 and 14, particularly for the forming of walls 38 in the openings freed between photoluminescent blocks 32, 33, 90.

FIGS. 32 to 39 illustrate the structures obtained at successive steps of another embodiment of a method of manufacturing optoelectronic device 5.

The initial steps of the method comprise all the steps previously described in relation with FIG. 3.

Figure 32:
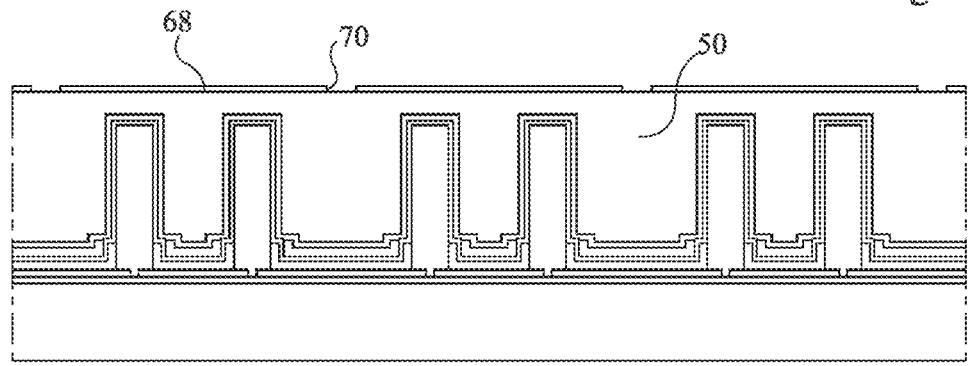
FIG. 32 is a cross-section view of the structure obtained at a step of another embodiment of a method of manufacturing the device of FIG. 1.

FIG. 32 shows the structure obtained after the deposition of layer 68, used as an etch mask, on transparent layer 50 and, at each desired location of a wall 38, the etching of an opening 70 in layer 68.

Figure 33:
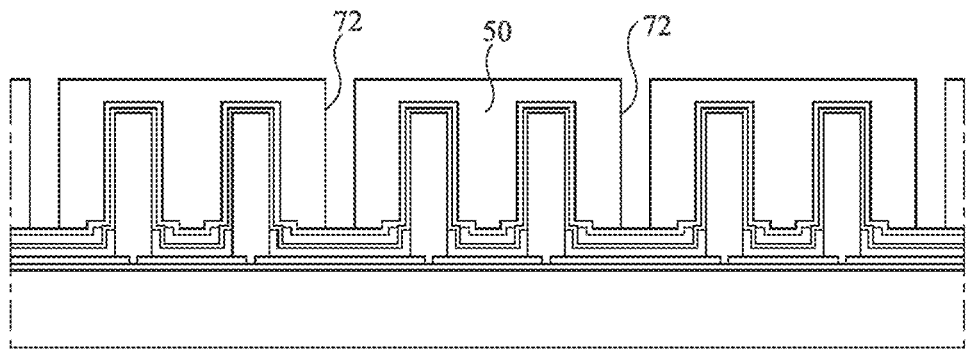
FIG. 33 is a cross-section view of the structure obtained at another step of the method.

FIG. 33 shows the structure obtained after the etching of opening 72, continuing each opening 70, in transparent layer 50 across the entire thickness of transparent layer 50.

Figure 34:
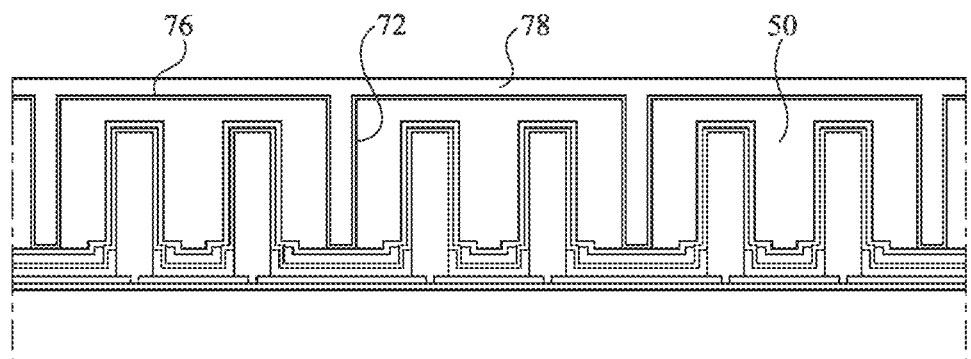
FIG. 34 is a cross-section view of the structure obtained at another step of the method.

FIG. 34 shows the structure obtained after steps similar to the steps previously described in relation with FIG. 13 and comprising the deposition, over the entire structure shown in FIG. 33, of insulating layer 76 made of the material forming the coatings 42 of walls 38 and after the filling of openings 72 with the material forming the cores 40 of walls 38, which causes the forming of layer 78 of the filling material on transparent layer 50.

Figure 35:
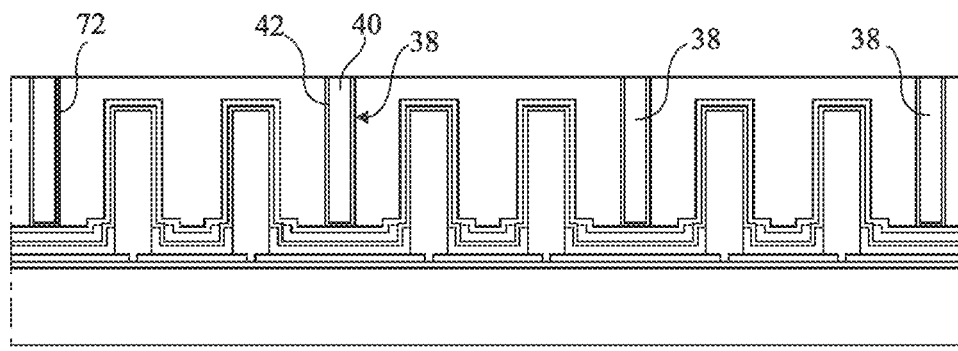
FIG. 35 is a cross-section view of the structure obtained at another step of the method.
Figure 36:
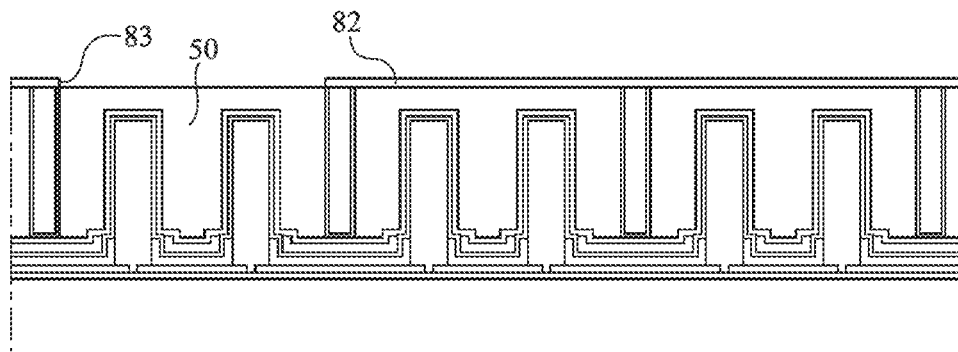
FIG. 36 is a cross-section view of the structure obtained at another step of the method.
Figure 37:
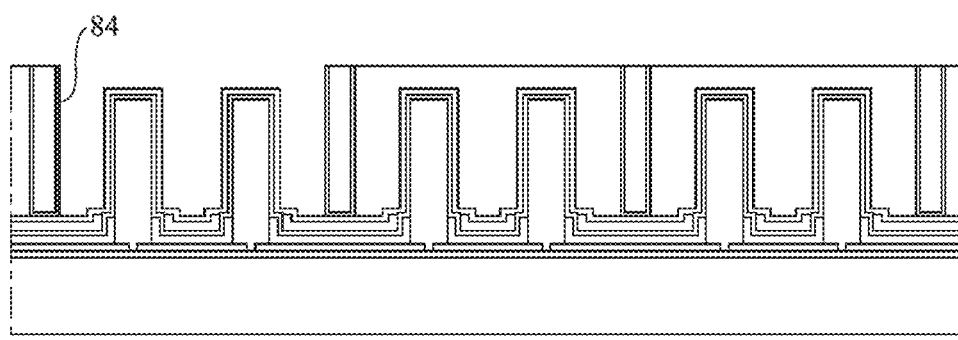
FIG. 37 is a cross-section view of the structure obtained at another step of the method.
Figure 38:
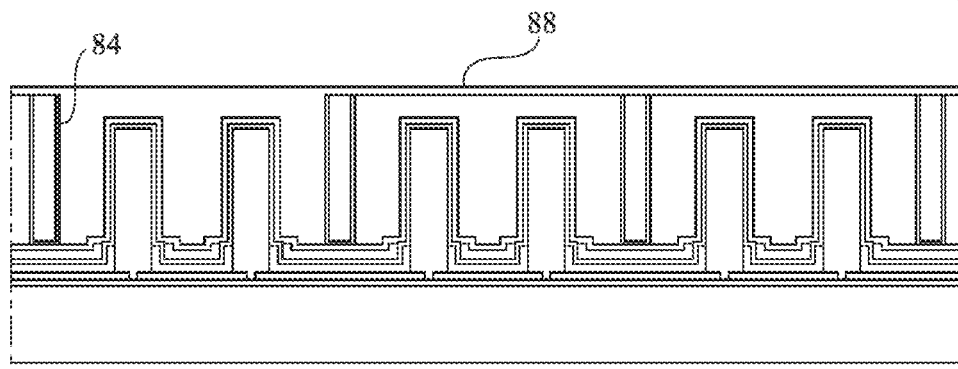
FIG. 38 is a cross-section view of the structure obtained at another step of the method.
Figure 39:
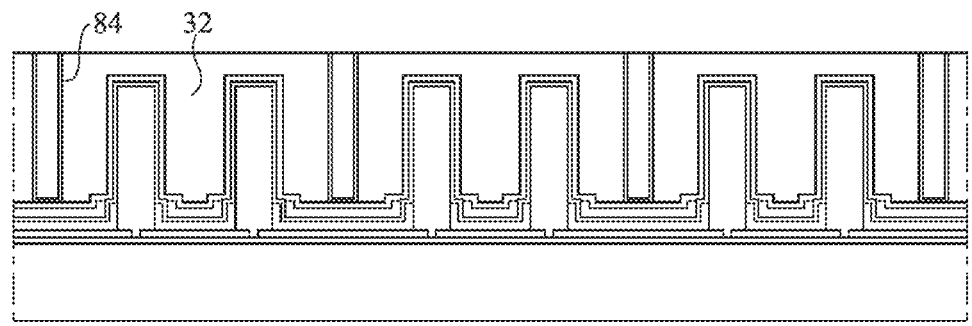
FIG. 39 is a cross-section view of the structure obtained at another step of the method.

FIG. 35 shows the structure obtained after a step of etching to remove layer 78 of the filling material and the portions of layer 76 located outside of openings 72, thus delimiting walls 38. As previously described, the portions of layer 78 outside of openings 72 may be removed by dry etching or CMP and the portions of layer 76 located outside of openings 72 may be removed by wet or dry etching.

FIGS. 36 to 39 show the structures obtained at the steps previously respectively described in relation with FIGS. 24 to 27 and result in the forming of the photoluminescent blocks 32 of the first type. These steps are repeated once for the forming of the photoluminescent blocks 33 of the second type and possibly once for the forming of the photoluminescent blocks 90 of the third type.

FIGS. 40 to 52 illustrate the structures obtained at successive steps of another embodiment of a method of manufacturing optoelectronic device 5.

The initial steps of the method comprise all the steps previously described in relation with FIG. 3.

Figure 40:
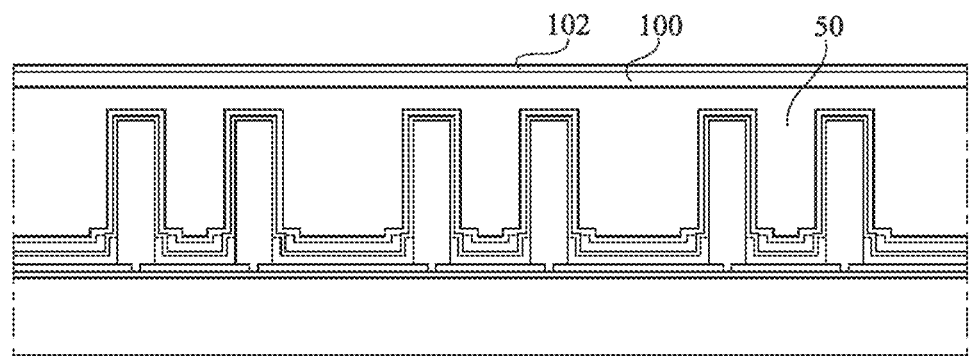
FIG. 40 is a cross-section view of the structure obtained at a step of another embodiment of a method of manufacturing the device of FIG. 1.

FIG. 40 shows the structure obtained after the deposition of a layer 100, used as an etch mask, and covering transparent layer 50, and of a resist layer 102 covering layer 100. Layer 100 may be made of one of the materials previously described for insulating layer 18, 24, 30, 36, 37, 46.

Figure 41:
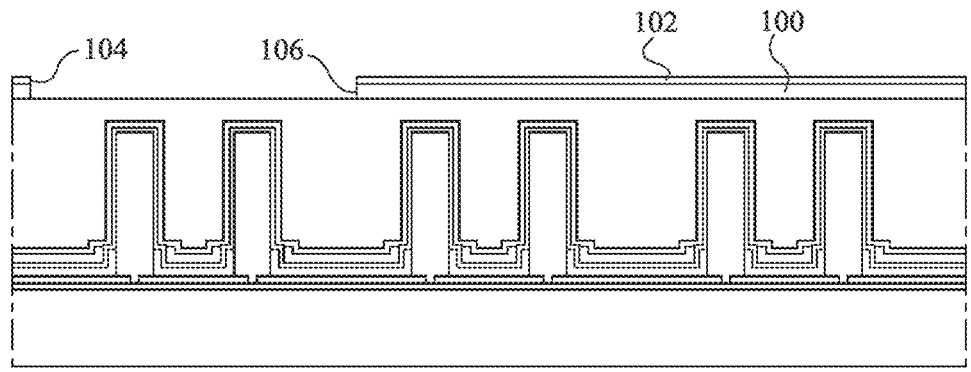
FIG. 41 is a cross-section view of the structure obtained at another step of the method.

FIG. 41 shows the structure obtained after the etching of an opening 104 in layer 102 and of an opening 106, continuing opening 104, in layer 100 at each desired location of a photoluminescent block 32 of the first type.

Figure 42:
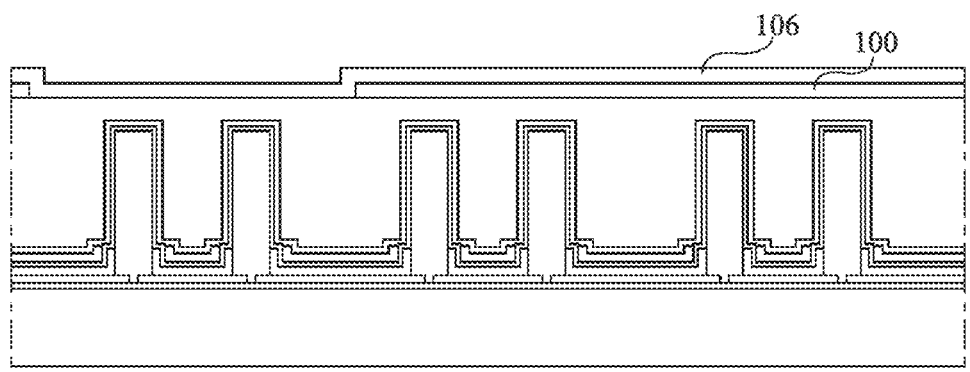
FIG. 42 is a cross-section view of the structure obtained at another step of the method.

FIG. 42 shows the structure obtained after the removal of resist layer 102 and the deposition of an insulating layer 106 over the entire structure. Layer 106 may be made of one of the materials previously described for insulating layer 18, 24, 30, 36, 37, 46.

Figure 43:
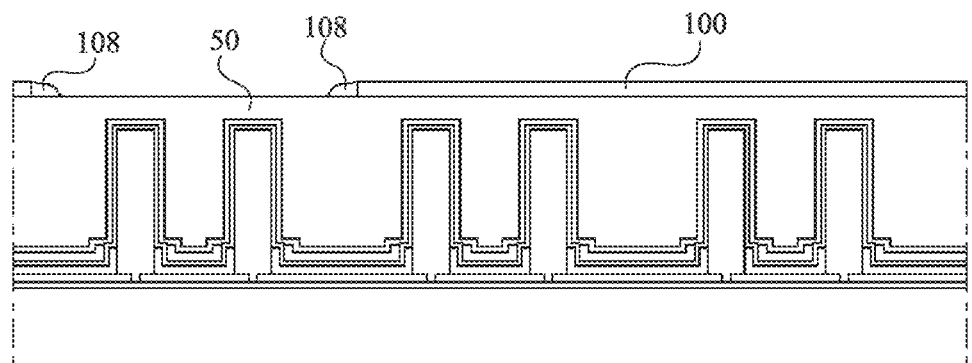
FIG. 43 is a cross-section view of the structure obtained at another step of the method.

FIG. 43 shows the structure obtained after an etching of insulating layer 106 causing the forming of portions 108 of insulating layer 106, called spacers, on the sides of each opening 104 and the removal of insulating layer 106 on the other hand. The etching may be a dry etching.

Figure 44:
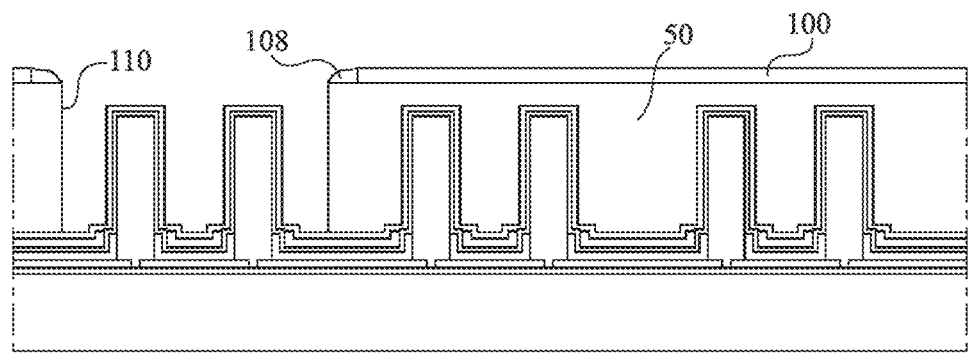
FIG. 44 is a cross-section view of the structure obtained at another step of the method.

FIG. 44 shows the structure obtained after the etching of an opening 110 in transparent layer 50 across the entire thickness of transparent layer 50, opening 110 being delimited by the mask formed by layer 100 and spacers 108.

Figure 45:
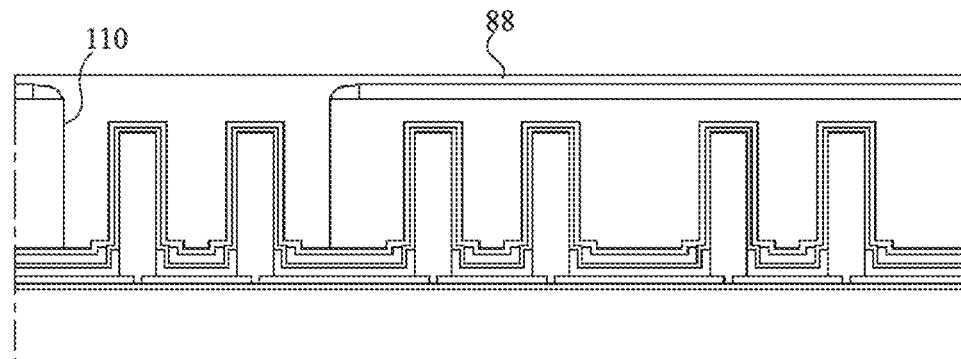
FIG. 45 is a cross-section view of the structure obtained at another step of the method.

FIG. 45 shows the structure obtained after having totally filled openings 110 with the material forming the photoluminescent blocks 32 of the first type. It may be a spin coating. The filling step causes the forming of layer 88 of the material forming photoluminescent blocks 32 on the rest of the structure outside of openings 110.

Figure 46:
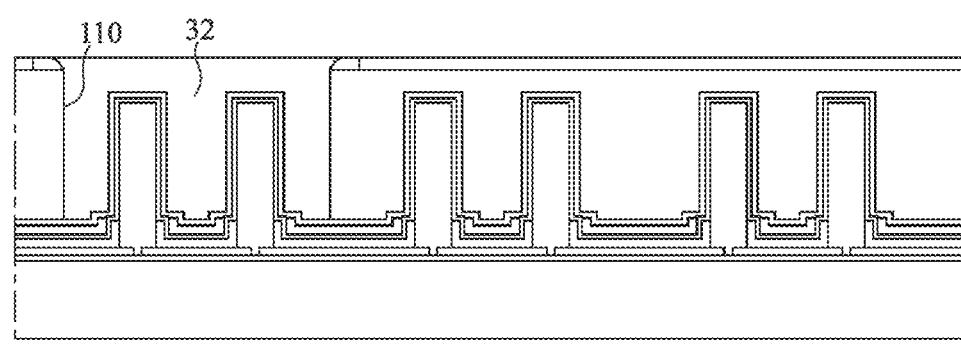
FIG. 46 is a cross-section view of the structure obtained at another step of the method.

FIG. 46 shows the structure obtained after a CMP step to remove layer 88. The photoluminescent blocks 32 of the first type are thus delimited.

Figure 47:
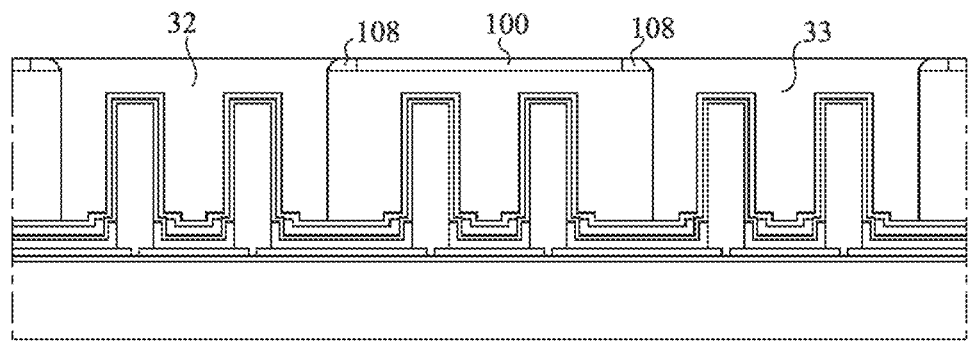
FIG. 47 is a cross-section view of the structure obtained at another step of the method.

FIG. 47 shows the structure obtained after having repeated the steps previously-described in relation with FIGS. 40 to 45 for the delimiting of the photoluminescent blocks 33 of the second type.

Figure 48:
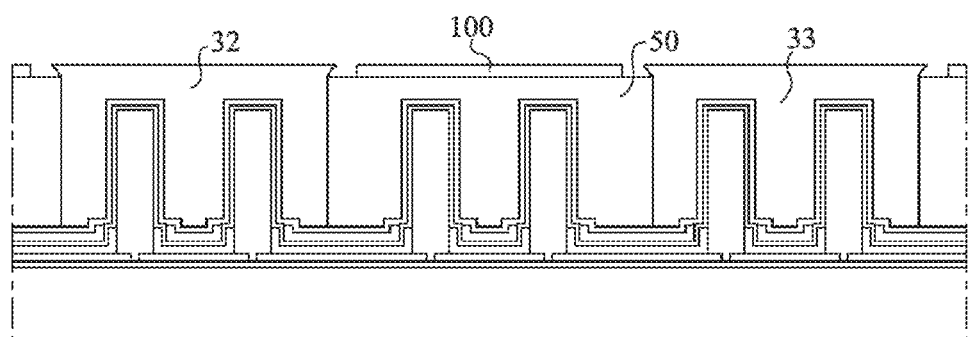
FIG. 48 is a cross-section view of the structure obtained at another step of the method.

FIG. 48 shows the structure obtained after having removed spacers 108, for example, by an etching selective over the materials forming photoluminescent blocks 32, 33, over the material forming transparent layer 50, and over the material forming insulating layer 100. It may be a dry etching or a wet etching.

Figure 49:
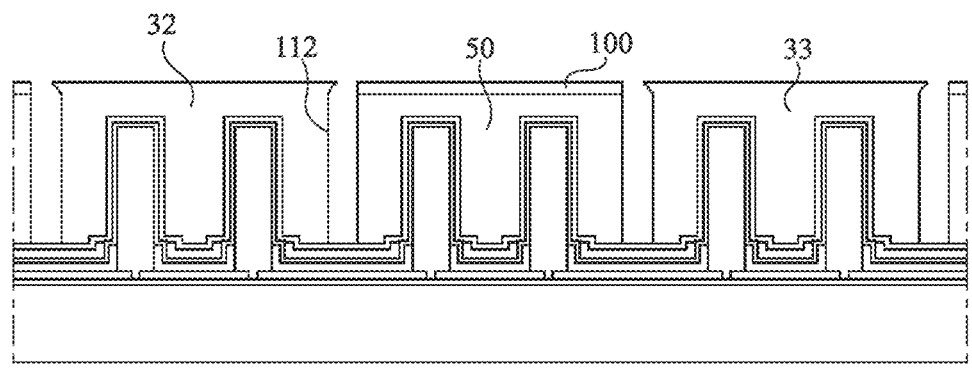
FIG. 49 is a cross-section view of the structure obtained at another step of the method.

FIG. 49 shows the structure obtained after having etched openings 112 in transparent layer 50, in line with the openings formed by the removal of spacers 108, across the entire thickness of transparent layer 50.

Figure 50:
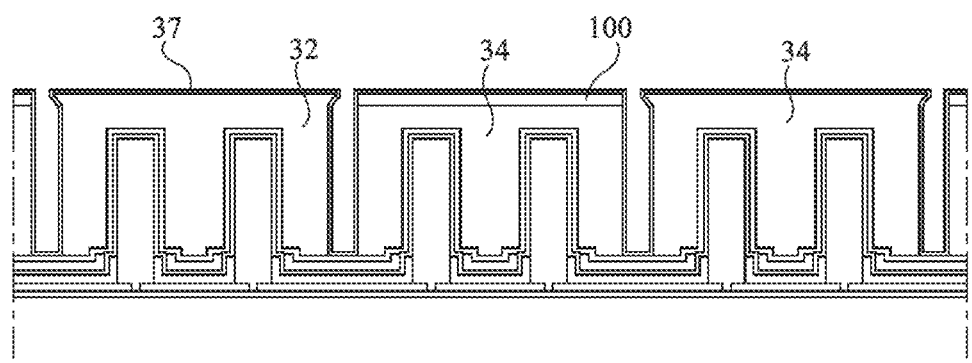
FIG. 50 is a cross-section view of the structure obtained at another step of the method.

FIG. 50 shows the structure obtained after the deposition, over the entire structure shown in FIG. 5, of insulating layer 37.

Figure 51:
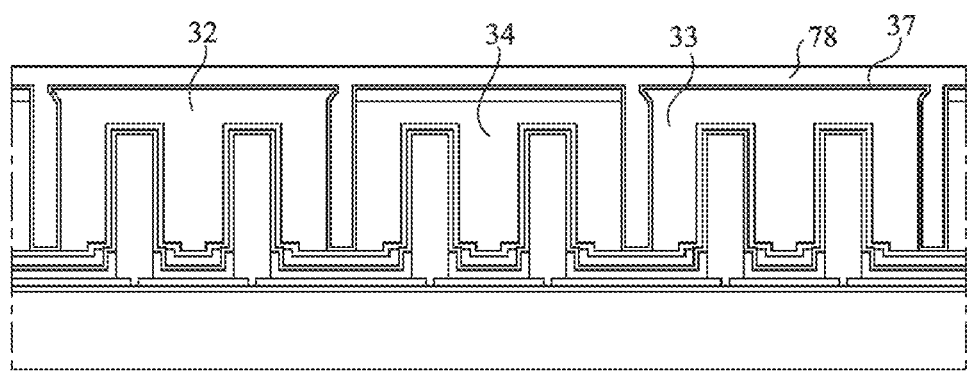
FIG. 51 is a cross-section view of the structure obtained at another step of the method.

FIG. 51 shows the structure obtained after the filling of openings 102 with the material forming the cores 40 of walls 38, which causes the forming of layer 78 of the filling material on blocks 32, 33, 34.

Figure 52:
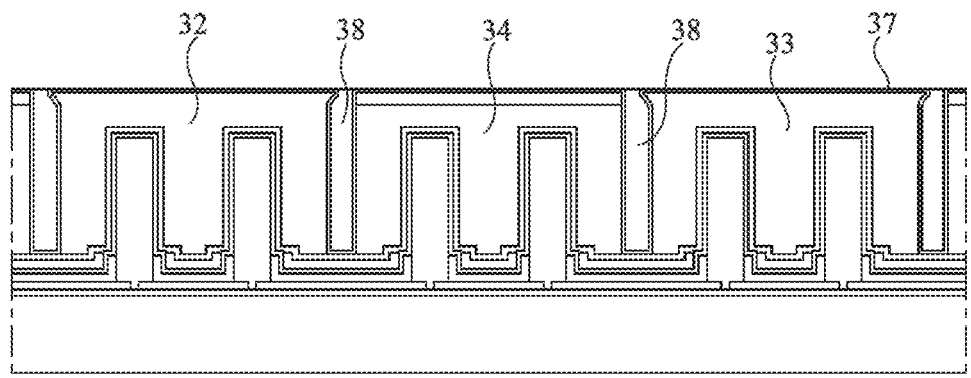
FIG. 52 is a cross-section view of the structure obtained at another step of the method.

FIG. 52 shows the structure obtained after a CMP step to remove layer 78 of the filling material and the portions of layer 76 located outside of openings 112, to expose the portions of insulating layer 37 covering the upper surfaces of blocks 32, 33, 34, thus delimiting walls 38.

Various embodiments and variants have been described. Those skilled in the art will understand that certain features of these various embodiments and variants may be combined, and other variants will occur to those skilled in the art. In particular, the optoelectronic device manufacturing methods may comprise additional steps which have not been described, for example, the transfer of the structure onto intermediate supports, also called handles, to allow the manipulation thereof. Finally, the practical implementation of the embodiments and variants described herein is within the capabilities of those skilled in the art based on the functional indications provided hereinabove.

The invention claimed is:

1. A method of manufacturing an optoelectronic device comprising assemblies of light-emitting diodes (LED) having first and second assemblies and first blocks made of a first photoluminescent material, each covering one of the first assemblies, the method comprising:

forming a layer covering the first and second assemblies;

delimiting first openings in the layer to expose the first assemblies;

filling the first openings with the first photoluminescent material; and performing a first chemical-mechanical polishing to delimit the first blocks, wherein the optoelectronic device comprises second blocks made of a second photoluminescent material, different from the first photoluminescent material, each covering one of the second assemblies;

after performing the first chemical-mechanical polishing to delimit the first blocks, delimiting second openings in the layer to expose the second assemblies;

filling the second openings with the second material; and performing a second chemical-mechanical polishing to delimit the second blocks.

2. The method according to claim 1, wherein the optoelectronic device further comprises third assemblies of light-emitting diodes (LED) and third blocks made of a third photoluminescent material, different from the first and second photoluminescent materials, each covering one of the third assemblies, the method comprising delimiting third openings in the layer to expose the third assemblies, filling the third openings with the third material, and performing a third chemical-mechanical polishing to delimit the third blocks.

3. The method according to claim 1, wherein the optoelectronic device further comprises fourth assemblies of light-emitting diodes (LED), the method comprising delimiting fourth blocks in the layer covering each of the fourth assemblies of light-emitting diodes.

4. The method according to claim 3, wherein the layer is at least partially transparent to the radiation emitted by the light-emitting diodes (LED) of the fourth assemblies of light-emitting diodes.

5. The method according to claim 1, comprising delimiting fourth openings in the layer between the assemblies and forming walls with reflective sides in the fourth openings.

6. The method according to claim 5, comprising depositing a reflective coating in the fourth openings and filling the rest of the fourth openings with a fifth material.

7. The method according to claim 5, wherein the walls are formed after the first photoluminescent blocks.

8. The method according to claim 7, comprising forming a barrier layer extending in the fourth openings and covering the first photoluminescent blocks before the forming of the walls.

9. The method according to claim 6,
wherein the walls are formed after the first and second photoluminescent blocks.

10. The method according to claim 5,
wherein the walls are formed before the first and second photoluminescent blocks.

11. The method according to claim 5,
wherein the optoelectronic device further comprises third assemblies of light-emitting diodes (LED) and third blocks made of a third photoluminescent material, different from the first and second photoluminescent materials, each covering one of the third assemblies, the method comprising delimiting third openings in the layer to expose the third assemblies, filling the third openings with the third material, and performing a third chemical-mechanical polishing to delimit the third blocks;

comprising etching the layer present between the first, second, and third photoluminescent blocks, forming a barrier layer extending in the fourth openings and covering the first, second, and third photoluminescent blocks before the forming of the walls, and forming the walls in the spaces present between the first, second, and third photoluminescent blocks.

12. The method according to claim 1, comprising the deposition of an etch mask layer, on the layer and, at each desired location of each first block, the etching of a fifth opening in the etch mask layer and the etching of the first opening, continuing the fifth opening, in the layer.

13. A method of manufacturing an optoelectronic device comprising assemblies of light-emitting diodes (LED) having first and second assemblies and first blocks made of a first photoluminescent material, each covering one of the first assemblies, the method comprising:
    forming a layer covering the first and second assemblies;
    delimiting first openings in the layer to expose the first assemblies;
    filling the first openings with the first material; and
    performing a chemical-mechanical polishing to delimit the first blocks;
    delimiting fourth openings in the layer between the assemblies; and
    forming walls with reflective sides in the fourth openings;
    wherein the walls are formed after the first photoluminescent blocks.

14. A method of manufacturing an optoelectronic device comprising assemblies of light-emitting diodes (LED) having first and second assemblies and first blocks made of a first photoluminescent material, each covering one of the first assemblies, the method comprising:
    forming a layer covering the first and second assemblies;
    delimiting first openings in the layer to expose the first assemblies;
    filling the first openings with the first material;
    performing a chemical-mechanical polishing to delimit the first blocks, wherein the optoelectronic device comprises second blocks made of a second photoluminescent material, different from the first photoluminescent material, each covering one of the second assemblies;
    delimiting second openings in the layer to expose the second assemblies;
    filling the second openings with the second material;
    performing a chemical-mechanical polishing to delimit the second blocks, wherein the optoelectronic device further comprises fourth assemblies of light-emitting diodes (LED);
    delimiting fourth blocks in the layer covering each of the fourth assemblies of light-emitting diodes, wherein the layer is at least partially transparent to the radiation emitted by the light-emitting diodes (LED) of the fourth assemblies of light-emitting diodes.

15. The method according to claim 14, comprising delimiting fourth openings in the layer between the assemblies and forming walls with reflective sides in the fourth openings.

* * * * *